(12) United States Patent
Opocensky et al.

(10) Patent No.: US 9,472,377 B2
(45) Date of Patent: Oct. 18, 2016

(54) METHOD AND APPARATUS FOR CHARACTERIZING METAL OXIDE REDUCTION

(71) Applicant: Lam Research Corporation, Fremont, CA (US)

(72) Inventors: Edward C. Opocensky, Aloha, OR (US); Tighe A. Spurlin, Portland, OR (US); Jonathan D. Reid, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/657,956

(22) Filed: Mar. 13, 2015

(65) Prior Publication Data

US 2016/0111344 A1    Apr. 21, 2016

Related U.S. Application Data

(60) Provisional application No. 62/065,545, filed on Oct. 17, 2014.

(51) Int. Cl.
*H01J 37/32* (2006.01)
*H01L 21/66* (2006.01)
(Continued)

(52) U.S. Cl.
CPC ............... *H01J 37/32* (2013.01); *C23C 8/12* (2013.01); *C23C 8/80* (2013.01); *H01J 37/32357* (2013.01);
(Continued)

(58) Field of Classification Search
CPC ............... H01J 37/32; H01J 37/32357; H01J 2237/338; H01L 21/76871; H01L 21/76876; H01L 21/324; H01L 22/26; H01L 21/76873; H01L 21/76843; H01L 21/76862; H01L 21/28562; H01L 21/02068; H01L 21/76874; H01L 21/76807; H01L 23/53238; H01L 21/76877; H01L 21/02063; H01L 21/76828; H01L 2221/1089; H01L 21/3141; H01L 21/32136; H01L 21/76856; H01L 21/76826; H01L 21/0228; H01L 21/3145; C25D 5/34; C25D 7/123; C23C 16/40; C23C 16/56; C23C 16/45525; C23C 16/45553
USPC ............................................................ 438/5
See application file for complete search history.

(56) References Cited

U.S. PATENT DOCUMENTS 4,642,161 A    2/1987    Akahoshi et al.
4,902,551 A    2/1990    Nakaso et al.
(Continued)

FOREIGN PATENT DOCUMENTS

CN    1639859 A    7/2005
CN    101730929 A    6/2010
(Continued)

OTHER PUBLICATIONS

U.S. Patent Application titled, "Pretreatment Method for Photoresist Water Processing," filed Apr. 21, 2014, U.S. Appl. No. 14/257,744.
(Continued)

*Primary Examiner* — Caleen Sullivan
(74) *Attorney, Agent, or Firm* — Weaver Austin Villeneuve & Sampson LLP

(57) ABSTRACT

Method and apparatus for characterizing metal oxide reduction using metal oxide films formed in an anneal chamber are disclosed. Oxygen is provided into an anneal chamber. A substrate including a metal seed layer is exposed to the oxygen and exposed to a heated substrate support in the anneal chamber to form a metal oxide of the metal seed layer. The oxidized substrate can be stored for later use or transferred to a processing chamber for reducing the metal oxide to metal. The oxidized substrates formed in this manner provide metal oxides that are repeatable, uniform, and stable. The oxidized substrate is exposed to a reducing treatment under conditions that reduce the metal oxide to metal in the form of a film integrated with the metal seed layer.

14 Claims, 14 Drawing Sheets

(51) Int. Cl.
*H01L 21/768* (2006.01)
*H01L 21/324* (2006.01)
*C23C 8/12* (2006.01)
*C23C 8/80* (2006.01)

(52) U.S. Cl.
CPC ....... *H01L 21/324* (2013.01); *H01L 21/76871* (2013.01); *H01L 21/76876* (2013.01); *H01L 22/26* (2013.01)

(56) References Cited

U.S. PATENT DOCUMENTS

| | | | |
|---|---|---|---|
| 4,904,621 | A | 2/1990 | Loewenstein et al. |
| 5,252,196 | A | 10/1993 | Sonnenberg et al. |
| 5,472,563 | A | 12/1995 | Kagawa et al. |
| 6,056,850 | A | 5/2000 | Blalock et al. |
| 6,086,956 | A | 7/2000 | Fakler et al. |
| 6,123,775 | A | 9/2000 | Hao et al. |
| 6,197,181 | B1 | 3/2001 | Chen |
| 6,204,192 | B1 | 3/2001 | Zhao et al. |
| 6,232,230 | B1 | 5/2001 | Iacoponi |
| 6,319,384 | B1 | 11/2001 | Taylor et al. |
| 6,432,821 | B1 | 8/2002 | Dubin et al. |
| 6,440,291 | B1 | 8/2002 | Henri et al. |
| 6,464,779 | B1 * | 10/2002 | Powell .............. C23C 16/18 117/102 |
| 6,610,192 | B1 | 8/2003 | Step et al. |
| 6,638,411 | B1 | 10/2003 | Mishima et al. |
| 6,664,122 | B1 | 12/2003 | Andryuschenko et al. |
| 6,680,540 | B2 | 1/2004 | Nakano et al. |
| 6,699,380 | B1 | 3/2004 | Chen et al. |
| 6,709,523 | B1 | 3/2004 | Toshima et al. |
| 6,720,204 | B2 | 4/2004 | Sudijono et al. |
| 6,743,719 | B1 | 6/2004 | Chen et al. |
| 6,764,952 | B1 | 7/2004 | Yu et al. |
| 6,793,796 | B2 | 9/2004 | Reid et al. |
| 6,815,349 | B1 | 11/2004 | Minshall et al. |
| 6,844,258 | B1 | 1/2005 | Fair et al. |
| 6,849,122 | B1 | 2/2005 | Fair |
| 6,902,605 | B2 | 6/2005 | Kolics et al. |
| 6,946,401 | B2 | 9/2005 | Huang et al. |
| 6,962,873 | B1 | 11/2005 | Park |
| 7,232,513 | B1 | 6/2007 | Webb et al. |
| 7,265,061 | B1 | 9/2007 | Cho et al. |
| 7,327,948 | B1 | 2/2008 | Shrinivasan et al. |
| 7,405,157 | B1 | 7/2008 | Reid et al. |
| 7,442,267 | B1 | 10/2008 | Webb et al. |
| 7,456,102 | B1 | 11/2008 | Varadarajan et al. |
| 7,799,684 | B1 | 9/2010 | Reid et al. |
| 7,851,232 | B2 | 12/2010 | Van Schravendijk et al. |
| 7,874,218 | B2 | 1/2011 | Izumi et al. |
| 7,879,218 | B1 | 2/2011 | Webb et al. |
| 7,897,198 | B1 | 3/2011 | Park et al. |
| 7,941,039 | B1 | 5/2011 | Shrinivasan et al. |
| 7,964,506 | B1 | 6/2011 | Ponnuswamy et al. |
| 8,033,771 | B1 | 10/2011 | Gage et al. |
| 8,043,958 | B1 | 10/2011 | Reid et al. |
| 8,084,339 | B2 | 12/2011 | Antonelli et al. |
| 8,084,399 | B2 | 12/2011 | Yu et al. |
| 8,137,465 | B1 | 3/2012 | Shrinivasan et al. |
| 8,137,467 | B2 | 3/2012 | Meinhold et al. |
| 8,197,662 | B1 | 6/2012 | Webb et al. |
| 8,217,513 | B2 | 7/2012 | Antonelli et al. |
| 8,242,028 | B1 | 8/2012 | Van Schravendijk et al. |
| 8,288,288 | B1 | 10/2012 | Gage et al. |
| 8,371,567 | B2 | 2/2013 | Angelov et al. |
| 8,372,754 | B2 | 2/2013 | Hanson et al. |
| 9,070,750 | B2 | 6/2015 | Spurlin et al. |
| 2001/0013473 | A1 | 8/2001 | Taylor |
| 2001/0014373 | A1 | 8/2001 | Lin et al. |
| 2001/0015321 | A1 | 8/2001 | Reid et al. |
| 2002/0008034 | A1 | 1/2002 | Chen et al. |
| 2002/0195352 | A1 | 12/2002 | Mayer et al. |
| 2003/0001271 | A1 | 1/2003 | Uozumi |
| 2003/0017628 | A1 * | 1/2003 | Li .................. G01N 27/041 438/14 |
| 2003/0036280 | A1 | 2/2003 | Jain et al. |
| 2003/0051665 | A1 | 3/2003 | Zhao et al. |
| 2003/0213561 | A1 | 11/2003 | Selwyn et al. |
| 2004/0000488 | A1 | 1/2004 | Yang |
| 2004/0050685 | A1 | 3/2004 | Yara et al. |
| 2004/0084301 | A1 | 5/2004 | Dordi et al. |
| 2004/0118697 | A1 | 6/2004 | Wen+ et al. |
| 2004/0142557 | A1 | 7/2004 | Levy et al. |
| 2004/0200244 | A1 | 10/2004 | Hong et al. |
| 2004/0217009 | A1 | 11/2004 | Mikkola et al. |
| 2004/0226827 | A1 | 11/2004 | Matsuda et al. |
| 2005/0167404 | A1 | 8/2005 | Yamazaki |
| 2005/0208754 | A1 | 9/2005 | Kostamo et al. |
| 2006/0223310 | A1 * | 10/2006 | Suzuki ............... C23C 16/16 438/652 |
| 2006/0283716 | A1 | 12/2006 | Hafezi et al. |
| 2007/0062818 | A1 | 3/2007 | Daviot et al. |
| 2008/0152822 | A1 | 6/2008 | Vaskelis et al. |
| 2008/0213994 | A1 | 9/2008 | Chebiam et al. |
| 2009/0095220 | A1 | 4/2009 | Meinhold et al. |
| 2009/0277867 | A1 | 11/2009 | Mayer et al. |
| 2010/0108491 | A1 | 5/2010 | Yoon et al. |
| 2010/0200412 | A1 | 8/2010 | Reid et al. |
| 2010/0317178 | A1 | 12/2010 | Antonelli et al. |
| 2010/0320081 | A1 | 12/2010 | Mayer et al. |
| 2011/0146571 | A1 | 6/2011 | Bartlett et al. |
| 2012/0211473 | A1 | 8/2012 | Goto et al. |
| 2014/0199497 | A1 | 7/2014 | Spurlin et al. |
| 2014/0256127 | A1 | 9/2014 | Spurlin et al. |
| 2014/0256128 | A1 | 9/2014 | Spurlin et al. |
| 2014/0357089 | A1 | 12/2014 | Buckalew et al. |
| 2015/0072538 | A1 | 3/2015 | Spurlin et al. |
| 2015/0218724 | A1 | 8/2015 | Mevellec et al. |
| 2015/0299886 | A1 | 10/2015 | Doubina et al. |
| 2015/0303065 | A1 | 10/2015 | Buckalew et al. |
| 2015/0376792 | A1 | 12/2015 | Spurlin et al. |
| 2016/0111342 | A1 | 4/2016 | Huang et al. |

FOREIGN PATENT DOCUMENTS

| | | |
|---|---|---|
| CN | 102804338 A | 11/2012 |
| WO | WO 2014/014907 | 1/2014 |
| WO | WO 2014/044942 | 3/2014 |

OTHER PUBLICATIONS

U.S. Patent Application titled, "Method and Apparatus for Preparing a Substrate with a Semi-Noble Metal Layer," filed Apr. 18, 2014, U.S. Appl. No. 14/256,671.

U.S. Patent Application titled, "Atmospheric Plasma Apparatus for Semiconductor Processing," filed Jun. 30, 2014, U.S. Appl. No. 14/320,171.

U.S. Patent Application titled, "Improved Deposit Morphology of Electroplated Copper," filed Jun. 11, 2012, U.S. Appl. No. 13/493,933.

U.S. Application titled, "Deposit Morphology of Electroplated Copper After Selective Removal of Copper Oxides During Pretreatment," Webb et al., filed Jul. 11, 2012, U.S. Appl. No. 13/546,146.

US Office Action, dated Dec. 9, 2014, issued in U.S. Appl. No. 13/741,151.

US Office Action, dated Jul. 18, 2014, issued in U.S. Appl. No. 13/787,499.

US Notice of Allowance, dated Feb. 6, 2015, issued in U.S. Appl. No. 13/787,499.

US Office Action, dated Dec. 3, 2014, issued in U.S. Appl. No. 14/086,770.

US Office Action, dated Oct. 18, 2005, issued in U.S. Appl. No. 10/741,048.

US Office Action, dated Mar. 9, 2006, issued in U.S. Appl. No. 10/741,048.

US Office Action, dated Mar. 17, 2006, issued in U.S. Appl. No. 10/741,048.

US Final Office Action, dated Jul. 18, 2006, issued in U.S. Appl. No. 10/741,048.

(56) References Cited

OTHER PUBLICATIONS

US Office Action, dated Nov. 27, 2006, issued in U.S. Appl. No. 10/741,048.
US Final Office Action, dated Apr. 24, 2007, issued in U.S. Appl. No. 10/741,048.
US Office Action, dated Aug. 9, 2007, issued in U.S. Appl. No. 10/741,048.
US Final Office Action, dated Dec. 14, 2007, issued in U.S. Appl. No. 10/741,048.
US Examiner's Answer Before the Board of Patent Appeals and Interferences, dated Jun. 18, 2008, issued in U.S. Appl. No. 10/741,048.
US Examiner's Decision on Appeal Before the Board of Patent Appeals and Interferences, dated Sep. 17, 2010, issued in U.S. Appl. No. 10/741,048.
US Notice of Allowance, dated Sep. 23, 2010, issued in U.S. Appl. No. 10/741,048.
US Notice of Allowance, dated Feb. 23, 2012, issued in U.S. Appl. No. 12/971,367.
US Office Action, dated May 1, 2013, issued in U.S. Appl. No. 13/493,933.
US Office Action, dated May 6, 2015, issued in U.S. Appl. No. 14/020,339.
US Final Office Action, dated May 20, 2015, issued in U.S. Appl. No. 14/086,770.
US Office Action, dated Oct. 23, 2015, issued in U.S. Appl. No. 14/086,770.
US Final Office Action, dated Apr. 22, 2016, issued in U.S. Appl. No. 14/086,770.
US Office Action, dated Feb. 5, 2016, issued in U.S. Appl. No. 14/256,671.
US Final Office Action, dated May 19, 2016, issued in U.S. Appl. No. 14/256,671.
US Office Action, dated Feb. 2, 2016, issued in U.S. Appl. No. 14/320,171.
US Office Action, dated Aug. 13, 2015, issued in U.S. Appl. No. 13/546,146.
US Final Office Action, dated Feb. 26, 2016, issued in U.S. Appl. No. 13/546,146.
Chinese First Office Action, dated Apr. 1, 2016, issued in Application No. CN 201410080405.0.
Chavez et al., (2001) "A Novel Method of Etching Copper Oxide Using Acetic Acid" *Journal of the Electrochemical Society*, 148(11):G640-G643.

\* cited by examiner

METHOD AND APPARATUS FOR CHARACTERIZING METAL OXIDE REDUCTION

CROSS-REFERENCE TO RELATED APPLICATIONS

This application claims the benefit of U.S. Provisional Patent Application No. 62/065,545, filed Oct. 17, 2014, and titled "METHOD OF PLASMA PROCESS CHARACTERIZATION USING METAL OXIDE FILMS," which is incorporated by reference herein in its entirety and for all purposes.

INTRODUCTION

1. Field of the Invention

This disclosure generally relates to forming a metal oxide on a substrate for use in characterizing metal oxide reduction. Certain aspects of this disclosure pertain to forming a metal oxide by exposing a substrate with a metal seed layer to oxygen and to elevated temperatures in an anneal chamber for use in characterizing metal oxide reduction.

2. Background

Formation of metal wiring interconnects in integrated circuits (ICs) can be achieved using a damascene or dual damascene process. Typically, trenches or holes are etched into dielectric material, such as silicon dioxide, located on a substrate. The holes or trenches may be lined with one or more adhesion and/or diffusion barrier layers. A thin layer of metal may be deposited in the holes or trenches that can act as a seed layer for electroplated metal. Thereafter, the holes or trenches may be filled with electroplated metal. Typically, the seed metal is copper. However, other metals such as ruthenium, palladium, iridium, rhodium, osmium, cobalt, nickel, gold, silver, and aluminum, or alloys of these metals, may also be used.

To achieve higher performance ICs, many of the features of the ICs are being fabricated with smaller feature sizes and higher densities of components. In some damascene processing, for example, copper seed layers on 2x-nm node features may be as thin as or thinner than 50 Å. In some implementations, metal seed layers on 1x-nm node features may be applied that may or may not include copper. Technical challenges arise with smaller feature sizes in producing metal seed layers and metal interconnects substantially free of voids or defects.

Metal in metal seed layers may react to form metal oxides from exposure to an environment containing oxygen. In plating a metal seed layer with metal, for example, the metal seed layer may be exposed to one or more instances of environments containing oxygen. A substrate including the metal seed layer can undergo several processes prior to plating that can lead to oxidation, such as when the substrate is transferred to an electroplating apparatus or when the substrate is cleaned (e.g., rinsed and dried). The formation of metal oxides can present several technical problems, especially in subsequent plating of metal on the metal seed layer. For example, plating metal on an oxidized seed layer can result in void formation, pitting, non-uniform plating, and adhesion/delamination problems.

Reduction of metal oxides to metal can be achieved using dry or wet reducing treatments. In some implementations, metal oxides can be reduced to metal using a plasma processing treatment. Various systems and apparatuses may be capable of reducing metal oxides to metal, though the effectiveness of such systems and apparatuses may not be certain. Determining and characterizing metal oxide reduction in such systems and apparatuses may be critical in monitoring, calibrating, testing, and qualifying the performance of the metal oxide reduction.

SUMMARY

This disclosure pertains to methods of characterizing metal oxide reduction, where the method includes: (a) providing oxygen into an anneal chamber, (b) providing a substrate with a metal seed layer formed thereon in the anneal chamber, (c) exposing the substrate to conditions for forming a metal oxide of the metal seed layer in the anneal chamber, (d) providing the substrate in a processing chamber, and (e) exposing the substrate to a reducing treatment under conditions that reduce the metal oxide to metal in the form of a film integrated with the metal seed layer.

In some implementations, providing the oxygen into the anneal chamber includes exposing the anneal chamber to atmospheric conditions. In some implementations, providing oxygen into the anneal chamber includes closing the anneal chamber from atmospheric conditions and flowing oxygen into the anneal chamber. In some implementations, exposing the substrate to conditions for forming the metal oxide includes converting greater than 90% of the metal of the metal seed layer to metal oxide. In some implementations, the method further includes heating a substrate support in the anneal chamber, where the substrate is provided on the heated substrate support. In some implementations, the method further includes measuring a first sheet resistance of the substrate prior to exposing the substrate to the reducing treatment, measuring a second sheet resistance of the substrate after exposing the substrate to the reducing treatment, and measuring a third sheet resistance of the substrate prior to exposing the substrate to conditions for forming the metal oxide.

This disclosure also pertains to an apparatus for characterizing metal oxide reduction, where the apparatus includes an anneal chamber, a substrate support for holding a substrate in the anneal chamber, where the substrate includes a metal seed layer, a processing chamber separate from the anneal chamber, and a controller configured with instructions for performing the following operations: (a) providing oxygen into the anneal chamber, (b) heating the substrate support in the anneal chamber, (c) exposing the substrate to the heated substrate support and to the oxygen to form a metal oxide of the metal seed layer in the anneal chamber, (d) transferring the substrate to the processing chamber, (e) exposing the substrate to a reducing treatment under conditions that reduce the metal oxide to metal in the form of a film integrated with the metal seed layer.

In some implementations, providing the oxygen into the anneal chamber includes exposing the anneal chamber to atmospheric conditions. In some implementations, the apparatus further includes a door configured to open and close the anneal chamber and a gas inlet for delivering oxygen into the anneal chamber, where providing oxygen into the anneal chamber includes flowing oxygen into the anneal chamber when the anneal chamber is closed. In some implementations, greater than 90% of the metal of the metal seed layer is converted to metal oxide after exposing the substrate to the heated substrate support and to the oxygen. In some implementations, the controller is further configured with instructions for measuring a first sheet resistance of the substrate prior to exposing the substrate to the reducing treatment, and measuring a second sheet resistance of the substrate after exposing the substrate to the reducing treatment. In some implementations, the apparatus further includes a remote plasma source coupled to the processing chamber, where exposing the substrate to the reducing treatment includes: forming a remote plasma of a reducing gas species in the remote plasma source, where the remote plasma includes one or more of: radicals, ions, and ultraviolet radiation from the reducing gas species, and exposing the substrate to the remote plasma.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

The process of depositing, or plating, metal onto a conductive surface via an electrochemical reaction can be referred to generally as electroplating or electrofilling. This can include electroless plating techniques. Bulk electrofilling refers to plating a relatively large amount of copper to fill trenches and vias.

Although the present disclosure may be used in a variety of applications, one very useful application is the damascene or dual damascene process commonly used in the manufacture of semiconductor devices. The damascene or dual damascene processes may include metal interconnects, such as copper interconnects. A generalized version of a dual damascene technique may be described with reference to FIGS. 1A-1C, which depicts some of the stages of the dual damascene process.

Figure 1A:
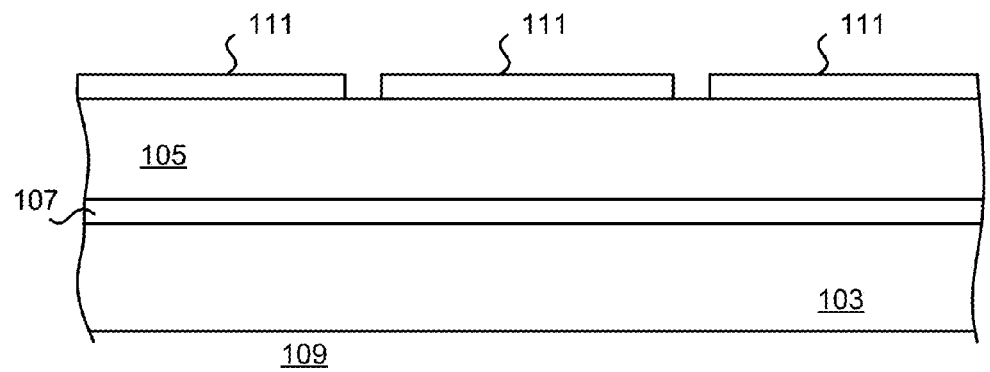
FIG. 1A shows an example of a cross-sectional schematic of dielectric layers prior to a via etch in a damascene process.

FIG. 1A shows an example of a cross-sectional schematic of one or more dielectric layers prior to a via etch in a damascene process. In a dual damascene process, first and second layers of dielectric are normally deposited in succession, possibly separated by deposition of an etch stop layer, such as a silicon nitride layer. These layers are depicted in FIG. 1A as a first dielectric layer 103, second dielectric layer 105, and etch stop layer 107. These are formed on an adjacent portion of a substrate 109, which a portion may be an underlying metallization layer or a gate electrode layer (at the device level).

Figure 1B:
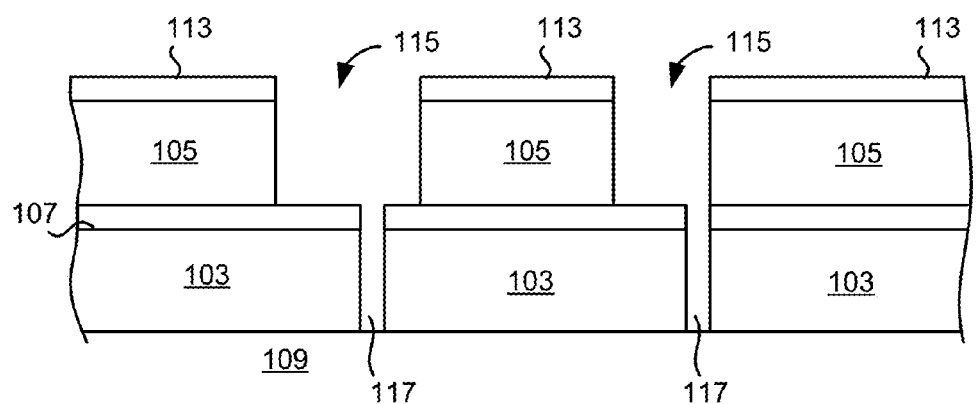
FIG. 1B shows an example of a cross-sectional schematic of the dielectric layers in FIG. 1A after an etch has been performed in the damascene process.

After deposition of the second dielectric layer 105, the process forms a via mask 111 having openings where vias will be subsequently etched. FIG. 1B shows an example of a cross-sectional schematic of the one or more dielectric layers in FIG. 1A after an etch has been performed in the damascene process. Next, vias are partially etched down through the level of etch stop 107. Then via mask 111 is stripped off and replaced with a line mask 113 as depicted in FIG. 1B. A second etch operation is performed to remove sufficient amounts of dielectric to define line paths 115 in second dielectric layer 105. The etch operation also extends via holes 117 through first dielectric layer 103, down to contact the underlying substrate 109 as illustrated in FIG. 1B.

Figure 1C:
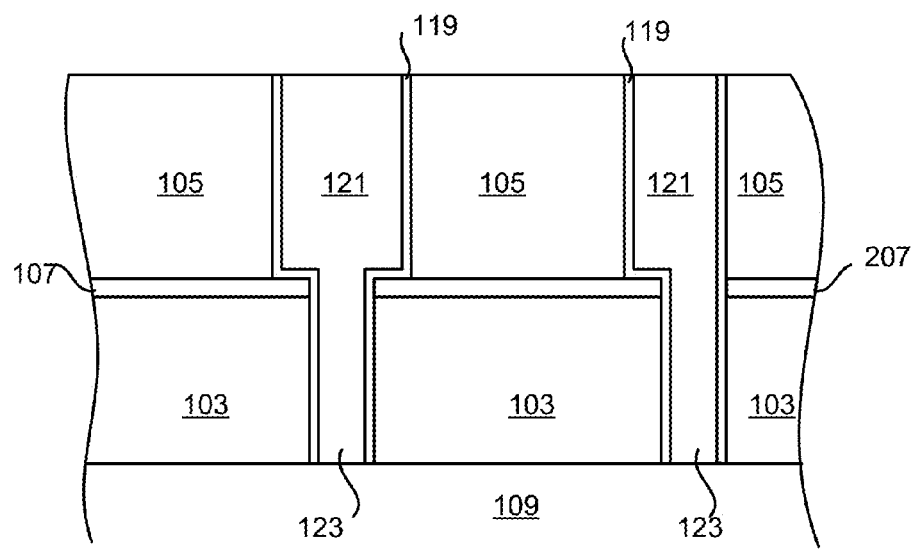
FIG. 1C shows an example of a cross-sectional schematic of the dielectric layers in FIGS. 1A and 1B after the etched regions have been filled with metal in the damascene process.

Thereafter, the process forms a thin layer of relatively conductive barrier layer material 119 on the exposed surfaces (including sidewalls) of dielectric layers 103 and 105. FIG. 1C shows an example of a cross-sectional schematic of the dielectric layers in FIGS. 1A and 1B after the etched regions have been coated with a conductive barrier layer material and filled with metal in the damascene process. Conductive barrier layer material 119 may be formed, for example, of tantalum nitride (TaN) or titanium nitride (TiN). A chemical vapor deposition (CVD), an atomic layer deposition (ALD), or a physical vapor deposition (PVD) operation is typically employed to deposit the conductive barrier layer material 119.

On top of the conductive barrier layer material 119, the process then deposits conductive metal 121 (typically, though not necessarily, copper) in the via holes and line paths 117 and 115. Conventionally this deposition is performed in two steps: an initial deposition of a metal seed layer followed by bulk deposition of metal by plating. The metal seed layer may be deposited by PVD, CVD, electroless plating, or any other suitable deposition technique known in the art. Note that the bulk deposition of copper not only fills line paths 115 but, to ensure complete filling, covers all the exposed regions on top of second dielectric layer 105. The metal 121 may serve as copper interconnects for IC devices. In some embodiments, metals other than copper are used in the seed layer. Examples of such other metals include cobalt, tungsten, and ruthenium.

The initial deposition of the metal seed layer can be achieved using a plating process. For example, an electroplating process can deposit a conformal and continuous copper seed layer onto a conductive surface. Electroplating the copper seed layer can include electroplating a semi-noble metal layer. The semi-noble metal layer may be part of a diffusion barrier or serve as the diffusion barrier. Typical diffusion barrier layers such as tantalum and tantalum nitride have relatively high resistivity (about 220 μΩ-cm), and in addition form highly stable oxides onto which electrodeposition of adherent densely nucleated films is difficult or impossible. Ruthenium, cobalt, and other semi-noble metals, which have a resistivity of about 9 μΩ-cm, may be deposited on a TaN layer to provide diffusion barrier/liners of relatively low resistivity.

Metal seed layers can readily react with oxygen or water vapor in the air and oxidize from a pure metal into a mixed film of a metal oxide and a buried pure metal. While oxidation under ambient conditions may be limited to a thin surface layer of some metals, such a thin layer may represent a significant fraction or perhaps the entire thickness of thin seed layers used in current technology nodes. The relatively thin layers may be necessitated by the technology node, such as the 4xnm node, the 3xnm node, the 2xnm node, and the 1xnm node, and less than 10 nm. The height to width aspect ratio of vias and trenches in technology nodes necessitating relatively thin metal layers can be about 5:1 or greater. In such technology nodes, the thickness of the metal seed layer can be less than about 100 Å on average as a result. In some implementations, the thickness of the metal seed layer can be less than about 50 Å on average.

Through the general chemical reactions shown in Equation 1 and Equation 2 below, metals used for seed layers and semi-noble metal layers are converted to metal oxides (Mox), though the exact reaction mechanisms between the metal surfaces (M) and ambient oxygen or water vapor can vary depending on the properties and the oxidation state.

$$2M_{(s)} + O_{2(g)} \rightarrow 2MOx_{(s)} \qquad \text{Equation 1}$$

$$2M_{(s)} + H_2O_{(g)} \rightarrow M_2Ox + H_{2(g)} \qquad \text{Equation 2}$$

For example, copper seed deposited on substrates is known to rapidly form copper oxide upon exposure to the air. A copper oxide film can form a layer that is approximately 20 Å and upwards to 50 Å thick on top of underlying copper metal. Moreover, cobalt layers deposited on substrates are known to rapidly form cobalt oxide. As metal seed layers become thinner and thinner, the formation of metal oxides from oxidation in ambient conditions can pose significant technical challenges.

Conversion of pure metal seed to metal oxide can lead to several problems. This is true not only in current copper damascene processing, but also for electroplating processes that use different conductive metals, such as ruthenium, cobalt, silver, aluminum, and alloys of these metals. First, an oxidized surface is difficult to plate on. Due to different interactions that electroplating bath additives can have on metal oxide and pure metal, non-uniform plating may result. As a result of the differences in conductivity between a metal oxide and a pure metal, non-uniform plating may further result. Second, voids may form in the metal seed that may make portions of the metal seed unavailable to support plating. The voids may form as a result of dissolution of metal oxide during exposure to corrosive plating solutions. The voids also may form on the surface due to non-uniform plating. Additionally, plating bulk metal on top of an oxidized surface can lead to adhesion or delamination problems, which can further lead to voids following subsequent processing steps, such as chemical mechanical planarization (CMP). Voids that result from etching, non-uniform plating, delamination, or other means may make the metal seed layer discontinuous, and unavailable to support plating. In fact, because modern damascene metal seed layers are relatively thin, such as about 50 Å or thinner, even a little oxidation may consume an entire layer thickness. Third, metal oxide formation may impede post-electrodeposition steps, such as capping, where the metal oxide may limit adhesion for capping layers.

The aforementioned issues may also occur for plating metal seed layers on semi-noble metal layers. Substrates with a semi-noble metal layer, such as a cobalt layer, may have significant portions of the semi-noble metal layer converted to oxide. Plating a metal seed layer, such as a copper seed layer, on the semi-noble metal layer can lead to void formation, pitting, non-uniform plating, and adhesion/delamination problems.

FIGS. 2A-2D show examples of cross-sectional schematics of a metal layer deposited on a conductive barrier layer. However, a person of ordinary skill in the art will understand that the metal layer may be part of the conductive barrier layer.

Figure 2A:
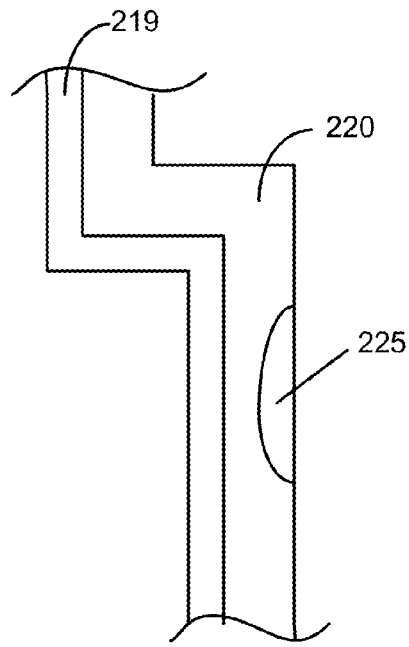
FIG. 2A shows an example of a cross-sectional schematic of an oxidized metal layer.

FIG. 2A shows an example of a cross-sectional schematic of an oxidized metal layer 220 deposited over a conductive barrier layer 219. In some implementations, the metal layer 220 may be oxidized upon exposure to oxygen or water vapor in ambient conditions, which can convert metal to a metal oxide 225 in a portion of the metal layer 220. The metal oxide 225 can be a native oxide. In the present disclosure, the metal layer 220 may be oxidized in an anneal chamber for use in characterizing the performance of metal oxide reduction, where the metal oxide 225 can be a thermal oxide.

Figure 2B:
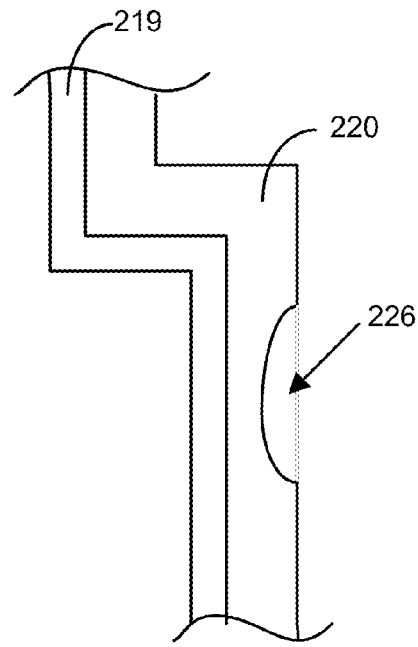
FIG. 2B shows an example of a cross-sectional schematic of a metal layer with a void due to removal of metal oxide.

FIG. 2B shows an example of a cross-sectional schematic of a metal layer 220 with a void due to removal of metal oxide. In some implementations, some solutions treat the metal oxide 225 by removal of the metal oxide 225, resulting in voids 226. For example, the metal oxide 225 can be removed by oxide etching or oxide dissolution by an acid or other chemical. Because the thickness of the void 226 can be relatively large with respect to the thinness of the metal layer 220, the effect of the void 226 on subsequent plating can be significant.

Figure 2C:
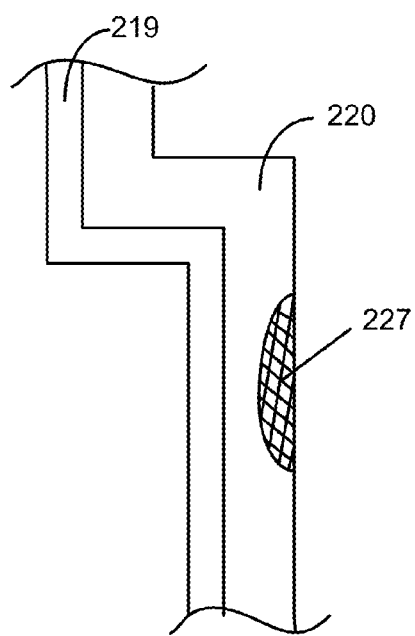
FIG. 2C shows an example of a cross-sectional schematic of a metal layer with reduced metal oxide forming a reaction product not integrated with the metal layer.

FIG. 2C shows an example of a cross-sectional schematic of a metal layer 220 with reduced metal oxide forming a reaction product not integrated with the metal layer. In some implementations, some treatments reduce the metal oxide 225 under conditions that agglomerate metal with the metal layer 220. In some implementations, reducing techniques generate metal particles 227, such as copper powder, that can agglomerate with the metal layer 220. The metal particles 227 do not form an integrated film with the metal layer 220. Instead, the metal particles 227 are not continuous, conformal, and/or adherent to the metal layer 220.

Figure 2D:
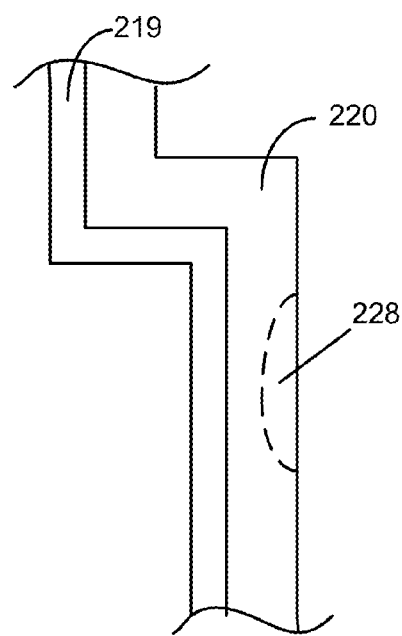
FIG. 2D shows an example of a cross-sectional schematic of a metal layer with reduced metal oxide forming a film integrated with the metal layer.

FIG. 2D shows an example of a cross-sectional schematic of a metal layer 220 with reduced metal oxide forming a film 228 integrated with the metal layer 220. In some embodiments, radicals of a reducing gas species, ions of the reducing gas species, UV radiation generated from excitation of the reducing gas species, or the reducing gas species itself can reduce the metal oxide 225. When process conditions for the reducing gas atmosphere are appropriately adjusted, the metal oxide 225 in FIG. 2A may convert to a film 228 integrated with the metal layer 220. The film 228 is not a powder. In contrast to the example in FIG. 2C, the film 228 can have several properties that integrate it with the metal layer 220. For example, the film 228 can be substantially continuous and conformal over the contours metal layer 220. Moreover, the film 228 can be substantially adherent to the metal layer 220, such that the film 228 does not easily delaminate from the metal layer 220.

Forming Metal Oxide for Use in Characterizing Metal Oxide Reduction

Disclosed herein is a method of producing a stable, repeatable, and uniform metal oxide on a substrate that can be used to characterize the performance of a metal oxide reduction process. Each substrate can provide a metal oxide that can be used to qualify and test an apparatus for reducing metal oxide to metal. The metal oxide can be formed in an anneal chamber and can behave similarly to native oxides of the metal. In some implementations, the apparatus can be a plasma processing reduction apparatus with a remote plasma source.

Forming a metal oxide on a metal seed layer is generally undesirable in semiconductor processing, especially in view of some of the problems discussed earlier in electroplating. Accordingly, systems and apparatuses are typically designed to eliminate or limit the formation of metal oxides. However, it may be uncertain how effective such systems and apparatuses perform with respect to reducing metal oxide to metal. To monitor and test the effectiveness of these systems and apparatuses for reducing metal oxide to metal, a process is provided for consistently producing a stable and uniform metal oxide on the substrate.

For applications that aim to form metal oxides, such as copper oxides, current technology can use a PECVD chamber. Using a PECVD chamber, a copper oxide and carbon film can be grown on one or more substrates. The one or more substrates are placed into the PECVD chamber and a radio-frequency (RF) plasma is used to form the copper oxide or to deposit carbon film. However, copper oxide grown on the one or more substrates are not uniform for each substrate, and the copper oxide grown on each substrate is not consistent substrate-to-substrate. Furthermore, the copper oxide itself does not share the same characteristics as native copper oxides. Without being limited by any theory, the copper oxide grown using a PECVD process may share different characteristics due in part to differences in surface roughness and due in part to incorporation of gases during plasma formation of the copper oxide. Moreover, the PECVD process may be a dedicated tool during use and can require more equipment setup, require longer process times, and inhibit the ability to run other processes simultaneously. The PECVD process may also not be compatible with metals other than copper.

The present disclosure can use thermal oxide growth rather than plasma. Adjustments in time, temperature, and metal film thickness can be made to tune results for specific applications. Forming stable, repeatable, and uniform metal oxide films can occur using thermal oxide growth under appropriate conditions. Thermal oxide growth can have the following advantages. First, the set up time can be reduced compared to a PECVD set up. Second, throughput can be higher because PECVD can operate slower than an anneal chamber. Third, the tool integrated with the anneal chamber can be available for other processing even during thermal oxide growth, whereas the PECVD tool is conventionally dedicated to a plasma process only. Fourth, the resulting oxide from thermal oxide growth is more uniform and the process more repeatable than the PECVD process. Fifth, the thermal oxide has properties that behave more similarly to its native oxide than a PECVD oxide. Sixth, the substrates can be batch processed and stored for later use with thermal oxide growth. Finally, other metals may be processed for similar purposes, while PECVD may be limited to copper.

Figure 3:
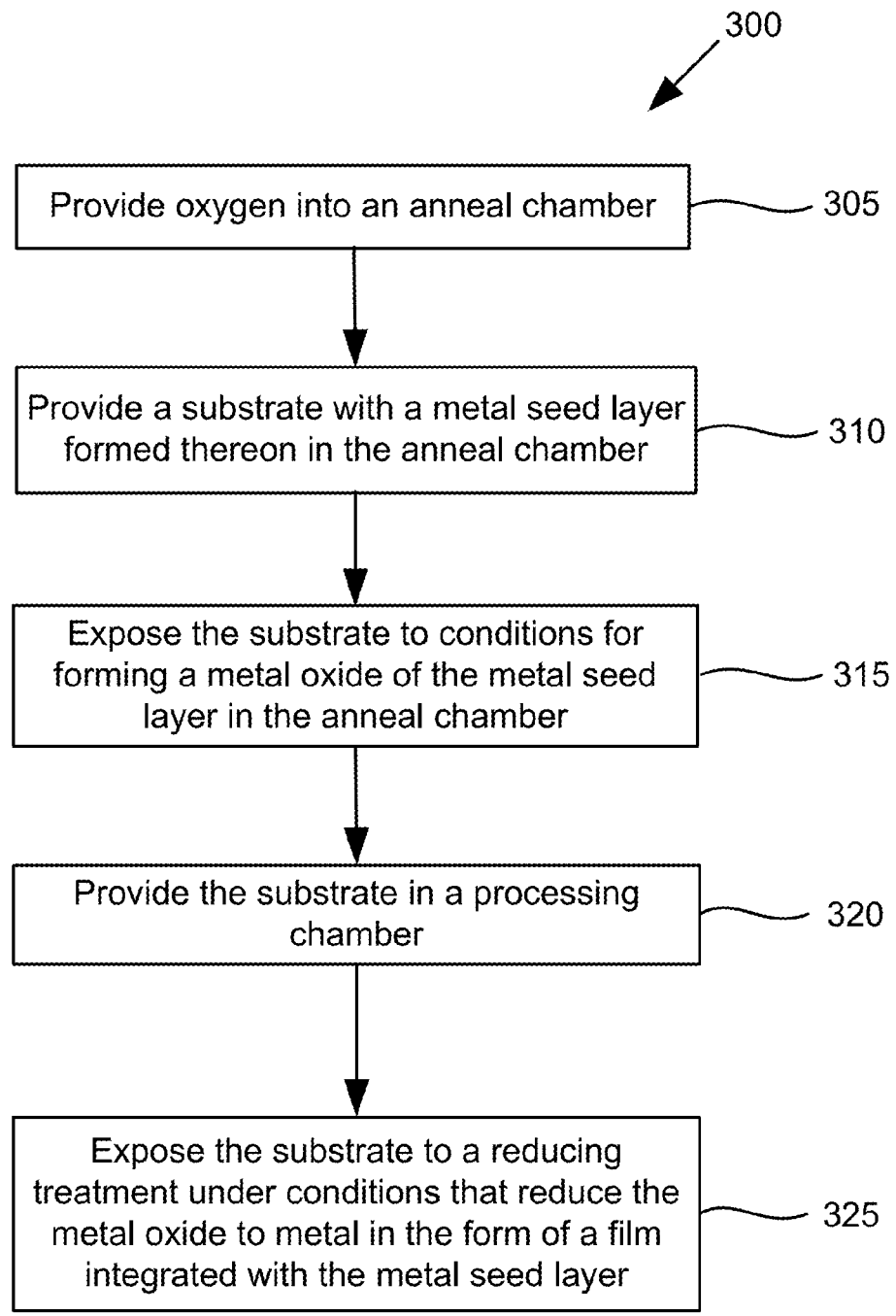
FIG. 3 shows a flow diagram illustrating an example method of characterizing metal oxide reduction.

FIG. 3 shows a flow diagram illustrating an example method of characterizing metal oxide reduction. The operations in a process 300 may be performed in different orders and/or with different, fewer, or additional operations.

A process 300 can begin at block 305, where oxygen is provided into an anneal chamber. Anneal chambers typically maintain an atmosphere that contain little to no oxygen. In some implementations, anneal chambers may include mass flow controllers (MFCs) configured to flow carrier or inert gases, such as hydrogen, nitrogen, and helium. However, the anneal chamber at block 305 can receive oxygen to create an oxygen-rich atmosphere. In some implementations, an oxygen-rich atmosphere can include between about 5% and about 100% oxygen, or between about 15% and about 100% oxygen. The oxygen-rich atmosphere in the anneal chamber at block 305 can include one or more gases in addition to oxygen. In some implementations, the oxygen-rich atmosphere can also include at least one of hydrogen, nitrogen, helium, neon, krypton, xenon, radon, and argon. The concentration of these gases can be controlled by MFCs.

Providing oxygen into the anneal chamber at block 305 can occur in different ways. In some implementations, providing oxygen into the anneal chamber includes exposing the anneal chamber to atmospheric conditions. Atmospheric conditions can include a pressure of at least 600 torr and an oxygen content of at least 15%. Exposure to atmospheric conditions allows air to flow into the anneal chamber, and the anneal chamber can be exposed for a duration of time to equilibrate with the atmospheric conditions. In some implementations, providing oxygen into the anneal chamber includes closing the anneal chamber from atmospheric conditions and flowing oxygen into the anneal chamber. Using an MFC or another component fluidly coupled to the anneal chamber, a controlled amount of oxygen can be flowed into the anneal chamber. The anneal chamber may be sealed from the external environment to provide a controlled atmosphere, where gases including oxygen may be delivered into the anneal chamber to control the concentration of gases in the atmosphere. In some implementations, one or more doors may be closed to seal the anneal chamber from the external environment. The one or more doors may facilitate increased gas purity in the anneal chamber and improved gas flow distribution and heat control.

At block 310 of the process 300, a substrate is provided with a metal seed layer formed thereon in the anneal chamber. Generally, the metal seed layer can be deposited using any appropriate deposition technique, such as physical vapor deposition (PVD), chemical vapor deposition (CVD), atomic layer deposition (ALD), electroplating, and electroless plating. In some implementations, the metal seed layer can be deposited on the substrate using PVD. In some implementations, the metal seed layer may be deposited on a blanket substrate, where the blanket substrate can provide a vehicle to repeatedly produce a film that can be measured before oxidation, after oxidation, and after reduction. In some implementations, the metal seed layer may be deposited on a patterned substrate, where the substrate can include one or more features having sidewalls and bottoms. The features can include trenches, recesses, and vias for copper interconnects in a damascene process. In some implementations, the features have a height to width aspect ratio of greater than about 5:1, such as greater than about 10:1. Patterned substrates with various metal types may be used and oxidized to further understand and evaluate geometric influences on oxide reduction.

A metal seed layer can be deposited on the substrate, where the metal seed layer can be formed over the surface of a blanket substrate or over the features of a patterned substrate. Examples of metals in the metal seed layer can include but are not limited to copper, ruthenium, palladium, iridium, rhodium, osmium, cobalt, nickel, gold, silver, and aluminum, or alloys of these metals. In some implementations, the metal seed layer can be a copper seed layer. Rather than a thin metal seed layer, the metal seed layer can be relatively thick. In some implementations, the metal seed layer can have an average thickness between about 50 Å and about 400 Å, such as between about 100 Å and about 250 Å. A thicker metal seed layer can be less sensitive to fluctuations in chemistry over time. In some implementations, the metal seed layer may be deposited on a semi-noble metal layer, where the semi-noble metal layer can serve as a diffusion barrier/liner of relatively low resistivity. In some implementations, the semi-noble metal layer can include cobalt. The metal seed layer and the semi-noble metal layer may be formed on a blanket substrate. However, in some implementations, one or both of the metal seed layer and the semi-noble metal layer can be continuous and conformally deposited over the features of a patterned substrate.

In some implementations, the anneal chamber may be part of an electroplating apparatus. That way, oxidation in the anneal chamber can occur in the same apparatus as the electroplating process without having to transfer to a separate tool. In some implementations, the oxidation process, reduction process, and plating process can be integrated in the same tool, thereby reducing the amount of equipment setup. Furthermore, the same tool may be available for other processing even when oxidation is being performed in the anneal chamber, whereas a separate tool (e.g., PECVD tool) may be dedicated to a single processing step only. Throughput may be increased not only by running oxidation and other processing steps simultaneously, but throughput for oxidation in an anneal chamber can be higher than oxidation in a PECVD tool.

In some implementations, the anneal chamber can include a substrate support (e.g., pedestal) for supporting the substrate. In some implementations, the substrate support can be temperature-controlled. The substrate support can transfer heat to the substrate via conduction, convection, radiation, or combinations thereof. In some implementations, the substrate support can be heated to heat the substrate to a temperature between about 50° C. and about 500° C., such as about 100° C. and about 400° C. The heated substrate support can increase or otherwise control the rate of oxidation of the substrate.

The process 300 can further include heating the substrate support in the anneal chamber. In some implementations, the substrate can be provided on the heated substrate support. The temperature of the heated substrate support can be between about 50° C. and about 500° C., between about 100° C. and about 400° C., or between about 150° C. and about 250° C.

Providing the substrate into the anneal chamber at block 310 can occur before, after, or simultaneous with providing oxygen into the anneal chamber at block 305. Thus, the order of block 305 and block 310 may be interchangeable with each other. That way, the substrate may already be provided or simultaneously provided into the anneal chamber with creating an oxygen-rich atmosphere in the anneal chamber.

At block 315 of the process 300, the substrate is exposed to conditions for forming a metal oxide of the metal seed layer in the anneal chamber. The substrate provided in the anneal chamber may be exposed to the oxygen-rich atmosphere of the anneal chamber. Oxygen may react with the metal to form metal oxide in a chemical reaction shown in Equation 1. The substrate may be exposed to the oxygen-rich atmosphere for a duration of time to convert all or substantially all of the metal seed layer to metal oxide. In some implementations, exposing the substrate to conditions for forming a metal oxide includes converting greater than about 90% of the metal of the metal seed layer to metal oxide.

In some implementations, exposing the substrate to conditions for forming the metal oxide includes simultaneously exposing the substrate to the oxygen in the anneal chamber and to the heated substrate support. Thus, the substrate can be heated to an elevated temperature while being exposed to oxygen in the atmosphere of the anneal chamber. Thermal oxides of the metal seed layer can form on the substrate that behave similarly to native oxides of the metal seed layer. In some implementations, the conditions for forming the thermal oxide include at least an oxygen-rich atmosphere and an elevated temperature, where the oxygen-rich atmosphere can include between about 5% oxygen and about 100% oxygen or between about 15% oxygen and 100% oxygen, and the temperature of the substrate can be heated to between about 100° C. and about 400° C. The pressure in the anneal chamber can be between about $1 \times 10^{-3}$ torr and about 1520 torr. In some implementations, the substrate can be exposed to such conditions for a sufficient period of time to convert all or substantially all of the metal seed layer to metal oxide, where the period of time can be between about 1 minute and about 10 minutes. Nonetheless, the time and temperature during exposure can vary depending on the thickness of the metal seed layer or the type of metal. The time and temperature during exposure can be configured to achieve a reproducible resistivity change of the substrate before and after oxidation. The time and temperature during exposure can also be configured to achieve a reproducible resistivity change of the substrate before oxidation and after reduction. In some implementations, the time and temperature during exposure can be selected to oxidize at least 90% or more of the metal to metal oxide. When oxidation is complete or when a desired amount of oxidation has occurred, the substrate may be cooled. In some implementations, the substrate may be transferred to a cooled pedestal to stop the reaction.

The metal oxide formed after exposure to the conditions in the anneal chamber can be stable, repeatable, and uniform. The metal oxide remains chemically stable over time so that the substrate is the same or substantially the same even after long periods of time. Thus, the substrate can be stored for later use without undergoing changes physically or chemically while in storage. The metal oxide is repeatable in that the characteristics of the metal oxide can be consistently reproduced under specified conditions in the anneal chamber. For example, when the substrate is exposed to a specific time and temperature, a consistent resistivity change of the substrate before and after the oxidation can be reproduced substrate-to-substrate. In addition, the metal oxide is uniform in that the oxidation of the metal seed layer is uniform across the substrate, or at least more uniform than the PECVD oxidation process. For example, the amount of oxidation of the metal seed layer does not significantly change from center-to-edge of the substrate.

The concentrations of the gases in the anneal chamber may be used to alter the characteristics of the metal oxide. Different reactive gases may be introduced into the anneal chamber to alter the composition of the film that grows on the metal seed layer. Also, by controlling the flow of gases in the anneal chamber, including the flow of oxygen, the rate of oxidation, the amount of oxidation, and the nature of the chemical reactions with the metal seed layer can be changed. For more precise composition control, the flow of gases can be controlled by MFCs. The gases may flow through a diffusor system to provide greater uniformity of distribution across the substrate. In addition, the temperature of the gases in the anneal chamber may be used to alter the characteristics of the metal oxide, where one or more gases may be heated or cooled in the anneal chamber. In some implementations, a vacuum pump can alter the pressure of the atmosphere in the anneal chamber, which can further change the characteristics of the metal oxide. The vacuum pump can further control atmosphere in the anneal chamber before and during gas injection.

At block 320 of the process 300, the substrate is provided in a processing chamber. The processing chamber may be configured to reduce metal oxides to metal. In some implementations, the substrate may be transferred from the anneal chamber to the processing chamber. In some implementations, the substrate may be transferred from storage to the processing chamber. The processing chamber may be configured to reduce metal oxides to metal using a dry reducing treatment or a wet reducing treatment. For a dry reducing treatment, the processing chamber can be a plasma processing chamber with a remote plasma source. In some implementations, the processing chamber can be part of the electroplating apparatus. Hence, the anneal chamber for oxidation, the processing chamber for reducing the metal oxides to metal, and a plating station for plating bulk metal on the metal seed layer may be integrated in a single tool.

At block 325 of the process 300, the substrate is exposed to a reducing treatment under conditions that reduce the metal oxide to metal in the form of a film integrated with the metal seed layer. In some implementations, the reducing treatment is a dry treatment that includes forming a remote plasma of a reducing gas species. Examples of a reducing gas species can include but is not limited to hydrogen and ammonia. The remote plasma can include radicals of the reducing gas species, ions of the reducing gas species, and UV radiation generated from excitation of the reducing gas species. The metal oxide of the metal seed layer can be exposed to the remote plasma to reduce the metal oxide to metal in the form of a film integrated with the metal seed layer. Characteristics of the film integrated with the metal seed layer are discussed in further detail with respect to FIGS. 2A-2D

The remote plasma may include radicals of the reducing gas species, such as, for example, $H^*$, $NH_2^*$, or $N_2H_3^*$. The radicals of the reducing gas species react with the metal oxide surface to generate a pure metallic surface. As demonstrated below, Equation 3 shows an example of reducing gas species such as hydrogen gas being broken down into hydrogen radicals. Equation 4 shows the hydrogen radicals reacting with the metal oxide surface to convert the metal oxide to metal. For hydrogen gas molecules that are not broken down or hydrogen radicals that recombine to form hydrogen gas molecules, the hydrogen gas molecules can still serve as a reducing agent for converting the metal oxide to metal, as shown in Equation 5. The radicals of the reducing gas species, ions of the reducing gas species, UV radiation from the reducing gas species, or the reducing gas species itself react with the metal oxide under conditions that convert the metal oxide to metal in the form of a film integrated with the metal seed layer.

$$H_2 \rightarrow 2H^* \qquad \text{Equation 3}$$

$$(x)2H^* + MOx \rightarrow M + (x)H_2O \qquad \text{Equation 4}$$

$$xH_2 + MOx \rightarrow M + xH_2O \qquad \text{Equation 5}$$

In some other implementations, the reducing treatment is a wet reducing treatment. The wet reducing treatment can include contacting the metal oxide of the metal seed layer with a solution containing a reducing agent. The reducing agent can include at least one of a boron-containing compound, such as a borane or borohydride, a nitrogen-containing compound, such as a hydrazine, and a phosphorus-containing compound, such as a hypophosphite. The solution can include additives like an accelerator or additives that increase the wetting potential of the surface of the copper seed layer or that increase the stability of the reducing agent. A wet reducing treatment for reducing metal oxides to metal in the form of a film integrated with a metal seed layer can be described in U.S. patent application Ser. No. 13/741,141, filed Jan. 14, 2013.

The substrate on which the metal oxide is formed can be used to monitor, calibrate, test, qualify, or characterize a subsequent metal oxide reduction process. In some implementations, the resistivity (e.g., sheet resistance) of the substrate can be measured before reduction and the resistivity of the substrate can be measured after reduction. Other forms of analysis may be used to characterize the oxidation of the metal seed layer, including but not limited to analyzing the visual appearance of the substrate. In some implementations, the process 300 further includes measuring a first sheet resistance of the substrate prior to exposing the substrate to the reducing treatment and measuring a second sheet resistance of the substrate after exposing the substrate to the reducing treatment. The measurements can be used to characterize the reducing treatment to determine if the reducing treatment is performing effectively and consistently. In some implementations, the process 300 can further include measuring a third sheet resistance of the substrate prior to exposing the substrate to conditions for forming the metal oxide. Regardless of the first sheet resistance of the substrate prior to exposing the substrate to the reducing treatment, the second sheet resistance of the substrate after exposing the substrate to the reducing treatment can be consistent substrate-to-substrate. In some implementations, the substrate can be characterized visually or using a parameter such as resistivity, which can provide a visual and numerical indicator of the effectiveness of the reducing treatment. Such characterizations may be useful in measuring, monitoring, qualifying, and testing the effectiveness of a plasma processing chamber or any other reducing apparatus.

The substrate can be characterized in terms of oxide formation at the following stages: (1) before the oxide is formed, (2) after the oxide is formed, and (3) after the oxide is reduced. For example, the amount of oxide formation can be indicated by the resistivity change before the oxide is formed and after the oxide is formed. In another example, the amount of reduction of the oxide can be indicated by the resistivity after the oxide is reduced compared to the resistivity before the oxide is formed. Typically, the resistivity after the oxide is reduced is somewhat higher than the resistivity before the oxide is formed. If the resistivity after the oxide is reduced is reasonably close to the resistivity before the oxide is formed, this can be a good indicator of the performance of the metal oxide reduction process. If the change in resistivity is relatively large from before the oxide is reduced to after the oxide is reduced, then this can also be a good indicator of the performance of the metal oxide reduction process. Using such measurements of resistivity comparison and resistivity change, the quality of the reduction process can be reproducibly measured.

In some implementations, the process 300 further includes repeating the operations of block 305, block 310, and block 315 for a plurality of additional substrates prior to providing the substrate in the processing chamber at block 320. Each of the additional substrates may be identical or substantially identical. The aforementioned operations are repeated to reproducibly form metal oxides. Thus, each of the additional substrates may be oxidized to form a supply of substrates that can be used to monitor, calibrate, test, qualify, or characterize the performance of a processing chamber for reducing metal oxides to metal. The supply of additional substrates may be stored for later use.

In some implementations, the process 300 further includes repeating the operations of block 320 and block 325 for each of the plurality of additional substrates after exposing the substrate to the reducing treatment at block 315. Each of the additional substrates can undergo reducing treatments for reducing the metal oxides of the metal seed layers. After analyzing the reduction of the metal oxides for any of the additional substrates, the effectiveness of the plasma processing chamber or reducing apparatus can be determined.

The process 300 can monitor and verify the stability of a reducing treatment for reducing metal oxides. In some implementations, the process 300 allows for monitoring the stability and characterization of a plasma process used to reduce metal oxide (e.g., copper oxide) to metal prior to plating (e.g., damascene copper plating). Other reducing treatments may also be monitored and characterized from the metal oxides provided in the process 300.

Figure 4:
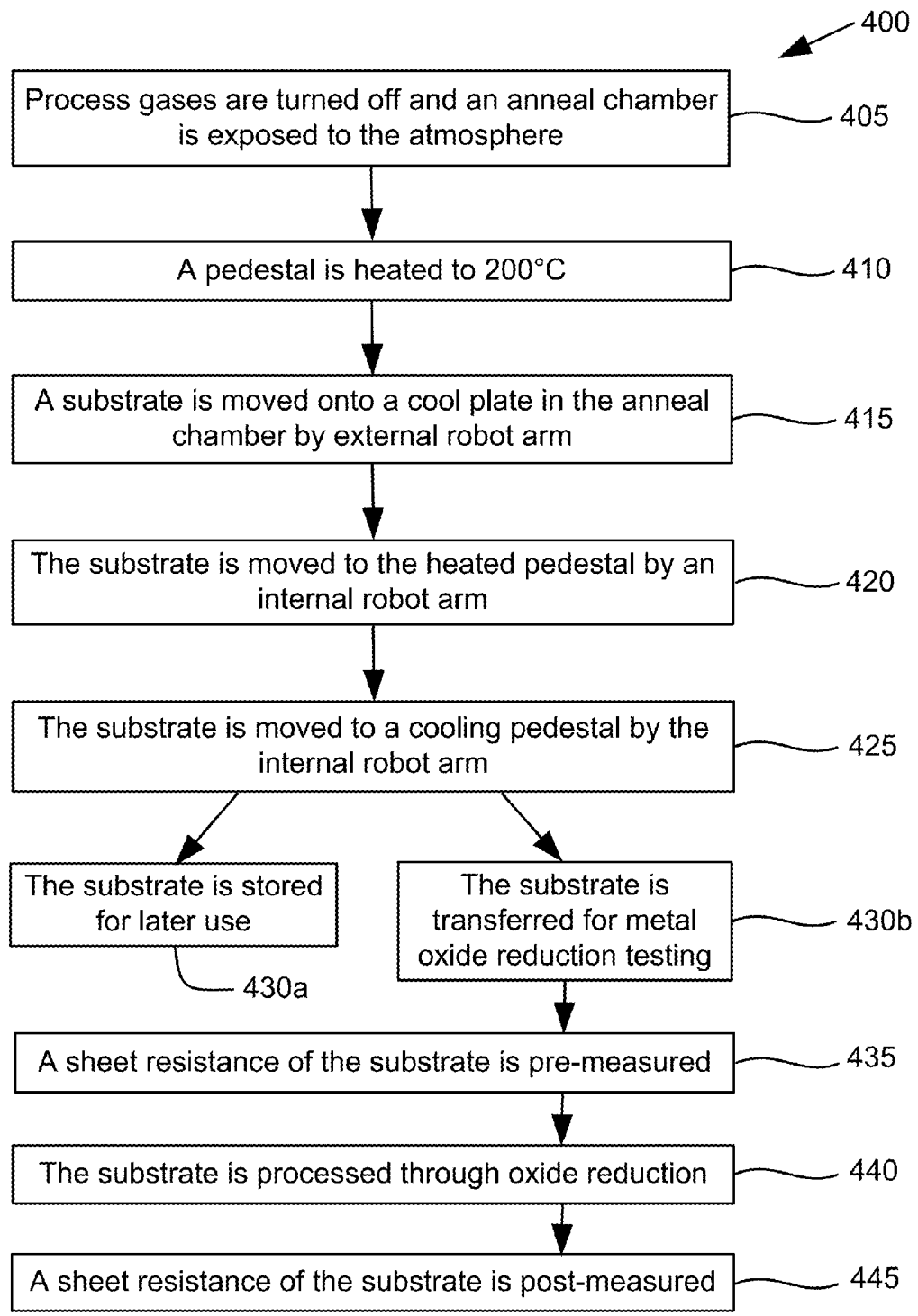
FIG. 4 shows a flow diagram illustrating an example process flow for forming a metal oxide on a substrate for use in characterizing metal oxide reduction.

FIG. 4 shows a flow diagram illustrating an example process flow for forming a metal oxide on a substrate for use in characterizing metal oxide reduction. The operations in a process 400 may be performed in different orders and/or with different, fewer, or additional operations.

The process 400 begins at block 405 where process gases are turned off in an anneal chamber and the anneal chamber is exposed to the atmosphere. MFCs may control the flow of various gases such as hydrogen, helium, and nitrogen into the anneal chamber, and the MFCs may be turned off to cease the flow of such gases into the anneal chamber. The anneal chamber can be opened to allow air from ambient conditions to enter into the anneal chamber, where the air can provide a source of oxygen. The pressure in the anneal chamber can be about 0.5 torr. The anneal chamber can be part of an electroplating apparatus, where the electroplating apparatus includes the anneal chamber, a plasma processing chamber, and a plating station. The exposed anneal chamber can provide an atmospheric anneal on a substrate.

At block 410 of the process 400, the pedestal is heated to at least 200° C. in the anneal chamber. The pedestal can be heated at the same time that the anneal chamber is exposed to the atmosphere. The anneal chamber can be exposed to the atmosphere for a stabilization period, where the stabilization period can last at least 15 minutes so that the anneal chamber can equilibrate with the atmosphere. The pedestal can also be heated to 200° C. during that stabilization period. The heated pedestal can provide a hot plate type anneal in the anneal chamber.

At block 415 of the process 400, a substrate is moved onto a cool plate in the anneal chamber by an external robot arm. The substrate can include a metal seed layer, such as a copper or tantalum seed layer. The metal seed layer can have a thickness between about 100 Å and about 250 Å. After the stabilization period ends in the anneal chamber, the substrate can be transferred via the external robot arm to a cool plate in the anneal chamber.

At block 420 of the process 400, the substrate is moved to the heated pedestal by an internal robot arm. During this time, the substrate is exposed to the oxygen-rich environment of the anneal chamber and exposed to the heated pedestal. The substrate can be exposed under such conditions for an oxidation period, where the oxidation period can be at least 2 minutes. The substrate can grow a thermal oxide film of the metal seed layer under such conditions.

At block 425 of the process 400, the substrate is moved to a cooling pedestal by the internal robot arm. After the oxidation period ends, the substrate is cooled by the cooling pedestal for a cooling period. The cooling period can be at least 25 seconds. The substrate can be subsequently transferred by the external robot arm from the cooling pedestal to another part of the electroplating apparatus.

After the substrate is cooled, the process 400 can continue at block 430a or block 430b. At block 430a, the substrate is stored for later use. The substrate includes a stable, repeatable, and uniform oxide film that can be used in advance of need. At block 430b, the substrate is transferred for metal oxide reduction testing. To perform metal oxide reduction testing, the substrate is pre-measured, processed through the plasma processing chamber, and post-measured.

At block 435, a sheet resistance of the substrate is pre-measured. In some implementations, the sheet resistance of the substrate can be pre-measured using four point probe apparatus, such as RS-100™ Four Point Probe, which is available from KLA-Tencor of Milpitas, Calif.

At block 440, the substrate is processed through oxide reduction. In some implementations, the oxide reduction can occur in a plasma processing chamber that includes a remote plasma source. The thermal oxide film can be exposed to a remote plasma to reduce the thermal oxide film to metal of the metal seed layer.

At block 445, a sheet resistance of the substrate is post-measured. In some implementations, the sheet resistance of the substrate can be post-measured using a four point probe apparatus, such as RS100™ Four Point Probe. The post-measured sheet resistance can be compared to the pre-measured sheet resistance to determine the effectiveness of the oxide reduction process and to determine if the reducing treatment is performing as expected.

Figure 5:
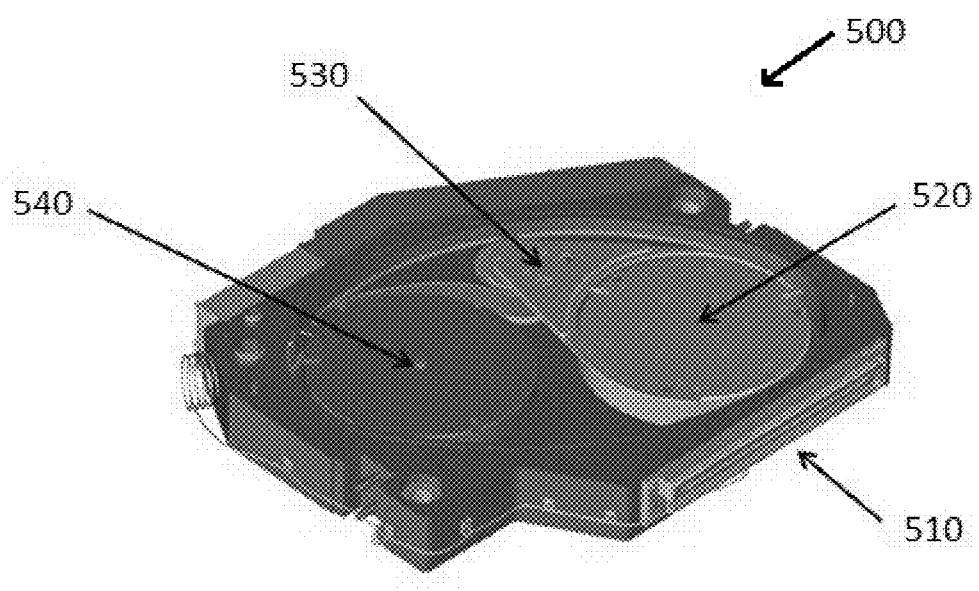
FIG. 5 shows a three-dimensional perspective view of an anneal chamber in an electroplating apparatus.

FIG. 5 shows a three-dimensional perspective view of an anneal chamber in an electroplating apparatus. The three-dimensional perspective view is a cutaway view of an anneal chamber 500 that can be part of an electroplating apparatus (not shown). In fact, the anneal chamber 500 may be one of many anneal chambers stacked on top of one another or in another arrangement in the electroplating apparatus. In some implementations, gas can flow into the anneal chamber 500 through a gas inlet (not shown) and out of the anneal chamber 500 through an exhaust (not shown). In some implementations, oxygen can flow into the anneal chamber 500 by exposure to atmospheric conditions. A substrate may be loaded into the anneal chamber 500 through an opening in the anneal chamber 500, such as a chamber slit 510. The anneal chamber 500 can include a cold plate 520 and a hot plate 540. The hot plate 540 can be heated to a temperature between about 50° C. and about 500° C., such as between about 100° C. and about 400° C. The cold plate 520 can remain at room temperature or at a temperature below room temperature, where room temperature is between about 18° C. and about 30° C. When the substrate is loaded into the anneal chamber 500, the substrate can be placed on the cold plate 510. An internal robot arm 530 can transfer the substrate from the cold plate 520 to the hot plate 540. The hot plate 540 can heat the substrate to a desired temperature for increasing or controlling the rate of oxidation of the substrate. The substrate can be placed on the hot plate 540 for a desired time to grow a thermal oxide film. Afterwards, the substrate can be transferred via the internal robot arm 530 from the hot plate 540 to the cold plate 520. The substrate can be cooled on the cold plate 520 to limit or otherwise stop the oxidation, and then transferred out of the anneal chamber 500 for subsequent processing.

The anneal chamber 500 for thermal oxide growth can include a pedestal for supporting a substrate, such as the hot plate 540. In some implementations, the anneal chamber 500 and the pedestal can be configured to provide a relatively uniform temperature across the substrate. In some implementations, the substrate may rest on sapphire balls, pins, or other minimum contact supports so that the surface of the substrate does not entirely rest on the pedestal. Gas may be flowed beneath the surface of the substrate to aid in uniform heat transfer by radiant heat. Temperature uniformity of the substrate may be controlled by one or more conditions during this process, such as substrate placement, gas flow, etc.

In some implementations, a pedestal heater may provide greater uniformity using a gradient design and having multiple heating zones. In some implementations, the pedestal heater can include a plurality of electrical rings. In some implementations, the pedestal heater can include UV lights or LED lights to adjust the intensity of the heat transferred to the substrate. In some implementations, the size of the pedestal heater may be changed to allow even more edge heating.

Figure 6:
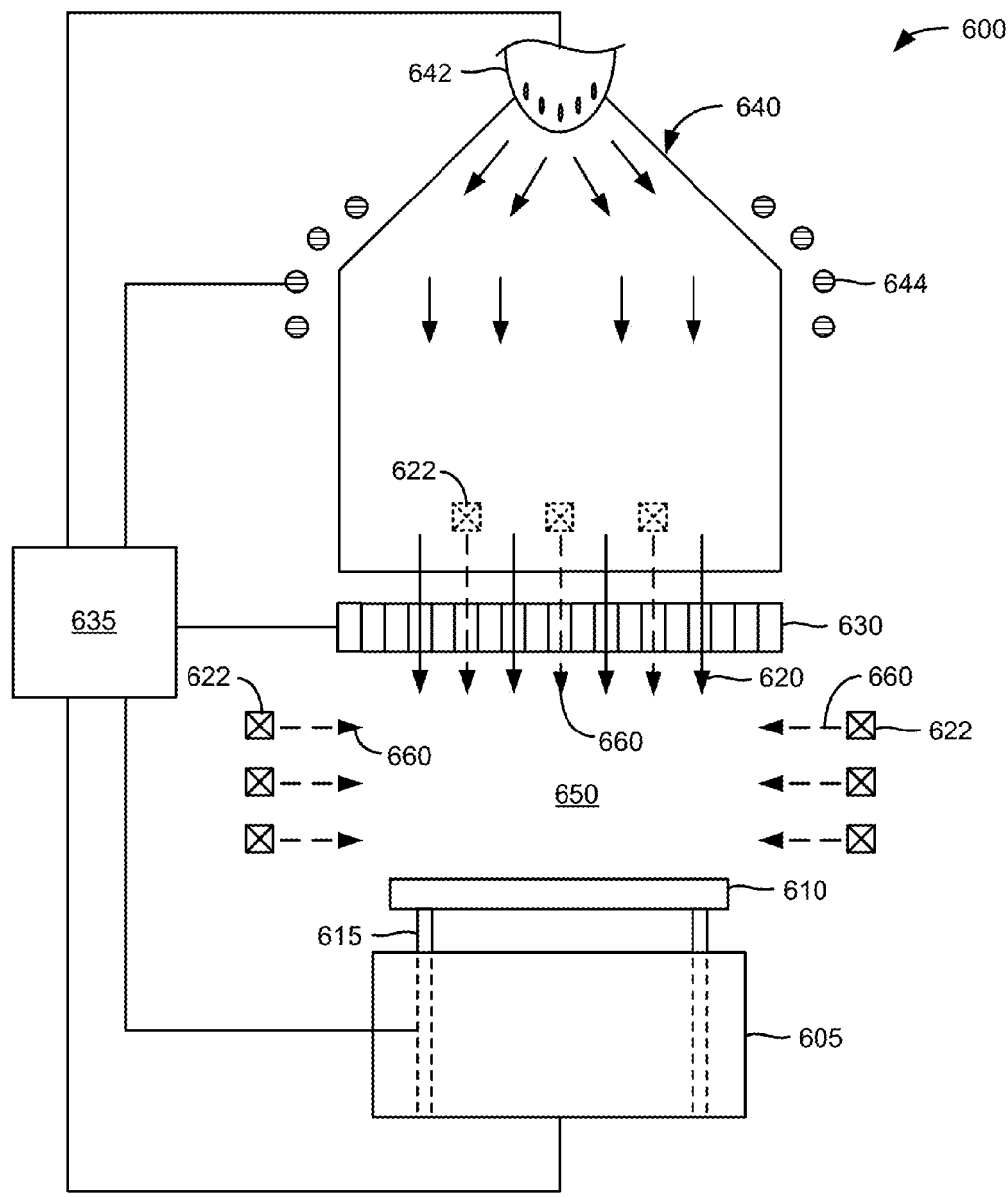
FIG. 6 shows an example of a cross-sectional schematic diagram of a remote plasma apparatus with a processing chamber.

FIG. 6 shows an example of a cross-sectional schematic diagram of a remote plasma apparatus with a processing chamber. The remote plasma apparatus 600 includes a processing chamber 650, which includes a substrate support 605 such as a pedestal, for supporting a substrate 610. The remote plasma apparatus 600 can include movable members 615, such as lift pins, which are capable of moving the substrate 610 away from or towards the substrate support 605. In addition, the remote plasma apparatus 600 can include one or more gas inlets 622 to flow cooling gas 660 through the processing chamber 650. The remote plasma apparatus 600 also includes a remote plasma source 640 over the substrate 610, and a showerhead 630 between the substrate 610 and the remote plasma source 640. A reducing gas species 620 can flow from the remote plasma source 640 towards the substrate 610 through the showerhead 630. The showerhead 630 may be configured to permit temperature control of the showerhead 630. A remote plasma may be generated in the remote plasma source 640 to produce radicals of the reducing gas species 620. The radicals can be carried in the gas phase towards the substrate 610 through the showerhead 630. The remote plasma may also include ions and other charged species of the reducing gas species. The remote plasma may further include photons, such as UV radiation, from the reducing gas species 620. The remote plasma may reduce metal oxides to metal on the substrate 610. Coils 644 may surround the walls of the remote plasma source 640 and generate a remote plasma in the remote plasma source 640. A controller 635 may contain instructions for controlling parameters for the operation of the remote plasma apparatus 600. The controller 635 will typically include one or more memory devices and one or more processors. The processor may include a CPU or computer, analog and/or digital input/output connections, stepper motor controller boards, etc. Aspects of the controller 635 may be further described with respect to the controller in FIGS. 7A and 7B. Implementations of a remote plasma apparatus 600 can be described in U.S. patent application Ser. No. 13/787,499 entitled "METHODS FOR REDUCING METAL OXIDE SURFACES TO MODIFIED METAL SURFACES USING A GASEOUS REDUCING ENVIRONMENT," filed Mar. 6, 2013 to Spurlin et al., U.S. patent application Ser. No. 14/020,339 entitled "METHOD AND APPARATUS FOR REMOTE PLASMA TREATMENT FOR REDUCING METAL OXIDES ON A METAL SEED LAYER," filed Sep. 6, 2013 to Spurlin et al., and U.S. patent application Ser. No. 14/086,770 entitled "METHOD AND APPARATUS FOR REMOTE PLASMA TREATMENT FOR REDUCING METAL OXIDES ON A METAL SEED LAYER," filed Nov. 21, 2013 to Spurlin et al., each of which is incorporated herein by reference in its entirety and for all purposes.

A remote plasma apparatus can be connected to an electrofill apparatus, such as an electroplating apparatus. The remote plasma apparatus can be a chamber configured to reduce metal oxides on a substrate, including native oxides, thermal oxides, and the like. In some implementations, the metal oxide can include copper oxide and the metal seed layer can include a copper seed layer. In the electrofill apparatus, copper oxide dissolves easily when exposed to current copper plating solutions, while copper metal dissolves more slowly. Reducing the copper oxide back to copper can improve the surface wetting behavior of the substrate and decrease copper dissolution, thereby reducing the chance of voiding in features of the substrate during plating. In addition to the remote plasma apparatus, the electrofill apparatus can be connected to one or more thermal anneal chambers. The one or more thermal anneal chambers can be configured to create stable, repeatable, and uniform metal oxide films on metal seed layers, where the metal oxide films can be used to test, monitor, and characterize the remote plasma apparatus. Programming instructions can be made on a system controller in communication with the one or more thermal anneal chambers.

Figure 7A:
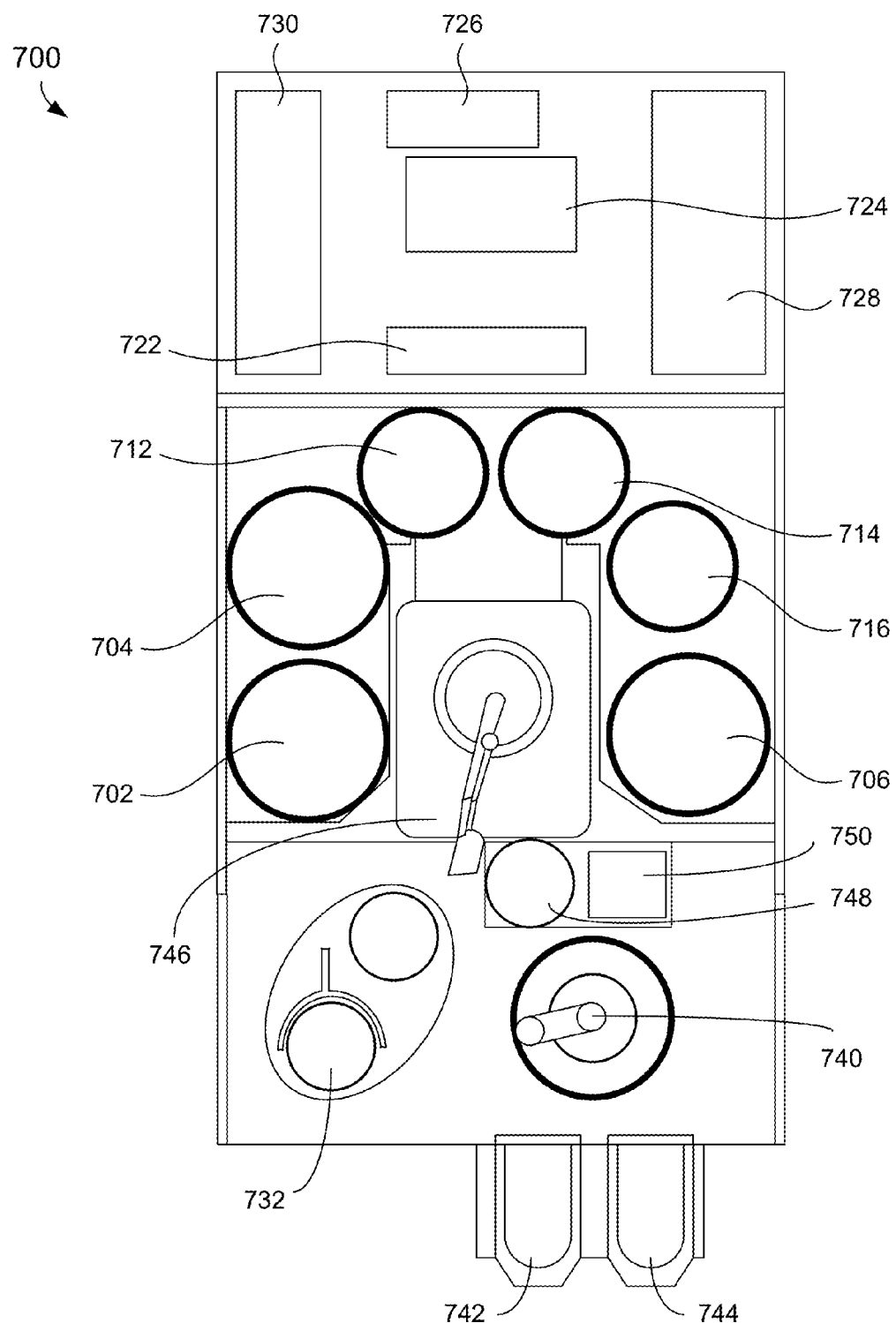
FIG. 7A shows an example of a top view schematic of an electroplating apparatus.

FIG. 7A shows an example of a top view schematic of an electroplating apparatus. The electroplating apparatus 700 can include three separate electroplating modules 702, 704, and 706. The electroplating apparatus 700 can also include three separate modules 712, 714, and 716 configured for various process operations. For example, in some implementations, modules 712 and 716 may be spin rinse drying (SRD) modules and module 714 may be an annealing station. However, the use of SRD modules may be rendered unnecessary after exposure to a reducing gas species from a remote plasma treatment. In some implementations, at least one of the modules 712, 714, and 716 may be post-electrofill modules (PEMs), each configured to perform a function, such as edge bevel removal, backside etching, acid cleaning, spinning, and drying of substrates after they have been processed by one of the electroplating modules 702, 704, and 706.

The electroplating apparatus 700 can include a central electroplating chamber 724. The central electroplating chamber 724 is a chamber that holds the chemical solution used as the plating solution in the electroplating modules 702, 704, and 706. The electroplating apparatus 700 also includes a dosing system 726 that may store and deliver additives for the plating solution. A chemical dilution module 722 may store and mix chemicals that may be used as an etchant. A filtration and pumping unit 727 may filter the plating solution for the central electroplating chamber 724 and pump it to the electroplating modules 702, 704, and 706.

In some implementations, the electroplating apparatus 700 includes an annealing station 732, where the annealing station 732 may be used to anneal substrates as pretreatment or oxidize substrates for qualifying and testing a metal oxide reduction process. As discussed, the annealing station 732 may be used to form metal oxides on a metal seed layer of a substrate for use in characterizing a subsequent metal oxide reduction process. For example, the annealing station 732 may be used to perform an atmospheric anneal to grow a metal oxide film, such as copper oxide or tantalum oxide. The annealing station 732 may include a pedestal capable of being heated to an elevated temperature. The annealing station 732 may be capable of being exposed to atmospheric conditions to create an oxygen-rich environment inside the annealing station 732. In some implementations, the annealing station 732 may also include one or more MFCs for flowing gases into the annealing station 732. The annealing station 732 may include a number of stacked annealing devices, e.g., five stacked annealing devices. The annealing devices may be arranged in the annealing station 732 one on top of another, in separate stacks, or in other multiple device configurations. An example of an annealing device can be described in FIG. 5.

A system controller 730 provides electronic and interface controls required to operate the electroplating apparatus 700. The system controller 730 (which may include one or more physical or logical controllers) controls some or all of the properties of the electroplating apparatus 700. The system controller 730 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 730 or they may be provided over a network. In certain implementations, the system controller 730 executes system control software.

The system control software in the electroplating apparatus 700 may include instructions for controlling conditions in the annealing station 732. This can include instructions for controlling pedestal temperature, gas flows, chamber pressure, substrate position, substrate rotation, timing, and other parameters performed by the electroplating apparatus 700. System control software may be configured in any suitable way. For example, various process tool component sub-routines or control objects may be written to control operation of the process tool components necessary to carry out various process tool processes. System control software may be coded in any suitable computer readable programming language.

In some implementations, system control software includes input/output control (IOC) sequencing instructions for controlling the various parameters described above. For example, each phase of an electroplating process may include one or more instructions for execution by the system controller 730, each phase of an oxidation process by the annealing station 732 may include one or more instructions for execution by the system controller 730, and each phase of the pretreatment or reducing process may include one or more instructions for execution by the system controller 730. In electroplating, the instructions for setting process conditions for an immersion process phase may be included in a corresponding immersion recipe phase. In pretreatment or reducing, the instructions for setting process conditions for exposing the substrate to a remote plasma may be included in a corresponding reducing phase recipe. In some implementations, the phases of electroplating and reducing processes may be sequentially arranged, so that all instructions for a process phase are executed concurrently with that process phase.

Other computer software and/or programs may be employed in some implementations. Examples of programs or sections of programs for this purpose include a substrate positioning program, an electrolyte composition control program, a pressure control program, a heater control program, a potential/current power supply control program. Other examples of programs or sections of this program for this purpose include a timing control program, movable members positioning program, a substrate support positioning program, a remote plasma apparatus control program, a pressure control program, a substrate support temperature control program, a showerhead temperature control program, a cooling gas control program, and a gas atmosphere control program.

In some implementations, there may be a user interface associated with the system controller 730. The user interface may include a display screen, graphical software displays of the apparatus and/or process conditions, and user input devices such as pointing devices, keyboards, touch screens, microphones, etc.

Signals for monitoring the process may be provided by analog and/or digital input connections of the system controller 730 from various process tool sensors. The signals for controlling the process may be output on the analog and digital output connections of the process tool. Non-limiting examples of process tool sensors that may be monitored include mass flow controllers, pressure sensors (such as manometers), thermocouples, etc. Appropriately programmed feedback and control algorithms may be used with data from these sensors to maintain process conditions, such as temperature of the substrate.

These systems may be integrated with electronics for controlling their operation before, during, and after processing of a semiconductor wafer or substrate. In general, the electronics are referred to as the controller 730, which may control various components or subparts of the system or systems. The controller 730, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 730 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 730 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller 730, in some implementations, may be a part of or coupled to a computer that is integrated with, coupled to the system, otherwise networked to the system, or a combination thereof. For example, the controller 730 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 730 receives instructions in the form of data, which specify parameters for each of the processing steps to be performed during one or more operations. It should be understood that the parameters may be specific to the type of process to be performed and the type of tool that the controller 730 is configured to interface with or control. Thus as described above, the controller 730 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

A hand-off tool 740 may select a substrate from a substrate cassette such as the cassette 742 or the cassette 744. The cassettes 742 or 744 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 740 may hold the substrate using a vacuum attachment or some other attaching mechanism The hand-off tool 740 may interface with the annealing station 732, the cassettes 742 or 744, a transfer station 750, or an aligner 748. From the transfer station 750, a hand-off tool 746 may gain access to the substrate. The transfer station 750 may be a slot or a position from and to which hand-off tools 740 and 746 may pass substrates without going through the aligner 748. In some implementations, however, to ensure that a substrate is properly aligned on the hand-off tool 746 for precision delivery to an electroplating module, the hand-off tool 746 may align the substrate with an aligner 748. The aligner 748 can include alignment pins against which the hand-off tool 740 pushes the substrate. When the substrate is properly aligned against the alignment pins, the hand-off tool 740 moves to a preset position with respect to the alignment pins. The hand-off tool 746 may also deliver a substrate to one of the electroplating modules 702, 704, or 706 or to one of the three separate modules 712, 714, and 716 configured for various process operations.

By way of an example, a metal seed layer may be deposited onto the substrate by PVD. In some implementations, the hand-off tool 740 may transfer the substrate from one of the FOUPs 742, 744 to the annealing station 732. The controller 730 may include instructions for providing oxygen into the annealing station 732. In some implementations, the annealing station 732 may be exposed to atmospheric conditions so air can enter. In some other implementations, oxygen may be flowed into the annealing station 732 while the annealing station 732 is closed from atmospheric conditions. The annealing station 732 may be modified to allow for atmospheric annealing or the annealing station 732 may be equipped to flow oxygen into the annealing station 732. The controller 730 may further include instructions for heating a substrate support in the annealing station 732, and expose the substrate to the heated substrate support and the oxygen in the annealing station 732. Exposure to the heated substrate support and the oxygen in the annealing station 732 can form a metal oxide of the metal seed layer. The substrate can be transferred by the hand-off tool 740 to a remote plasma apparatus 760 shown in FIG. 7B for reducing the metal oxide to metal in the form of a film integrated with the metal seed layer. The controller 730 may include instructions for transferring the substrate in and out of the annealing station 732. The controller 730 may also include instructions for measuring oxide formation at various stages, including (1) before the oxide is formed in the annealing station 732, (2) after the oxide is formed in the annealing station 732, and (3) after the oxide is reduced in the remote plasma apparatus 760. Such measurements may be useful in determining the performance of the remote plasma apparatus 760.

A single tool may be capable of performing the sequence of oxidation and reduction. The tool can include one or more plasma processing reduction chambers (e.g., remote plasma apparatus 760) and one or more annealing chambers (e.g., annealing station 732). In some implementations, the tool can include one or more plating stations (e.g., electroplating modules 702, 704, and 706).

Figure 7B:
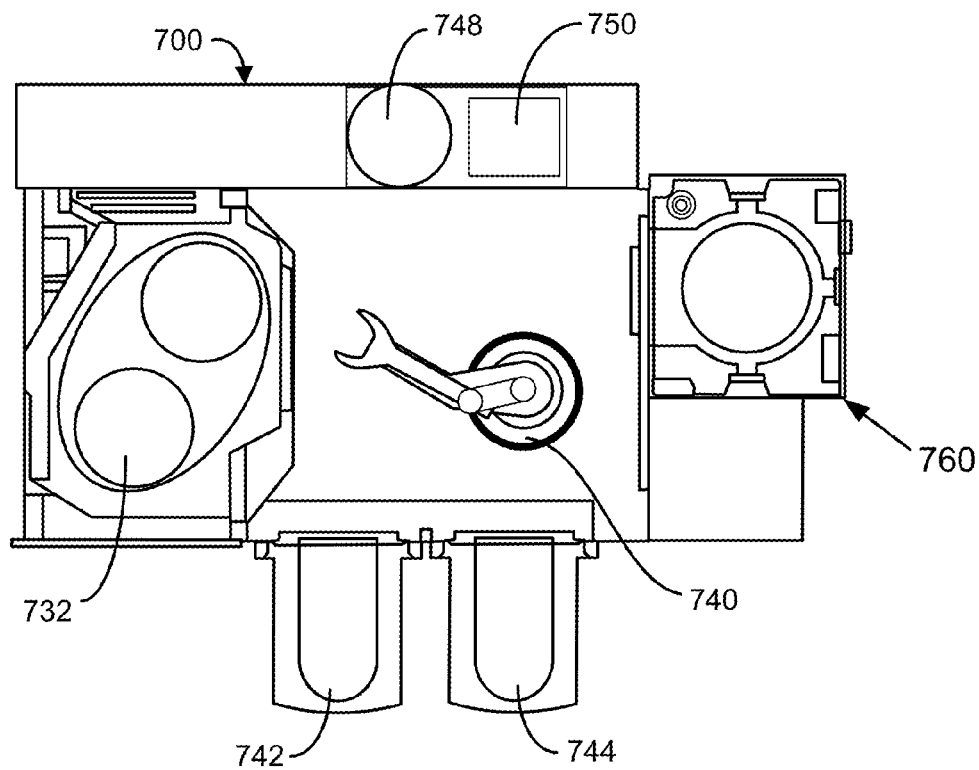
FIG. 7B shows an example of a magnified top view schematic of a remote plasma apparatus with an electroplating apparatus.
Figure 7C:
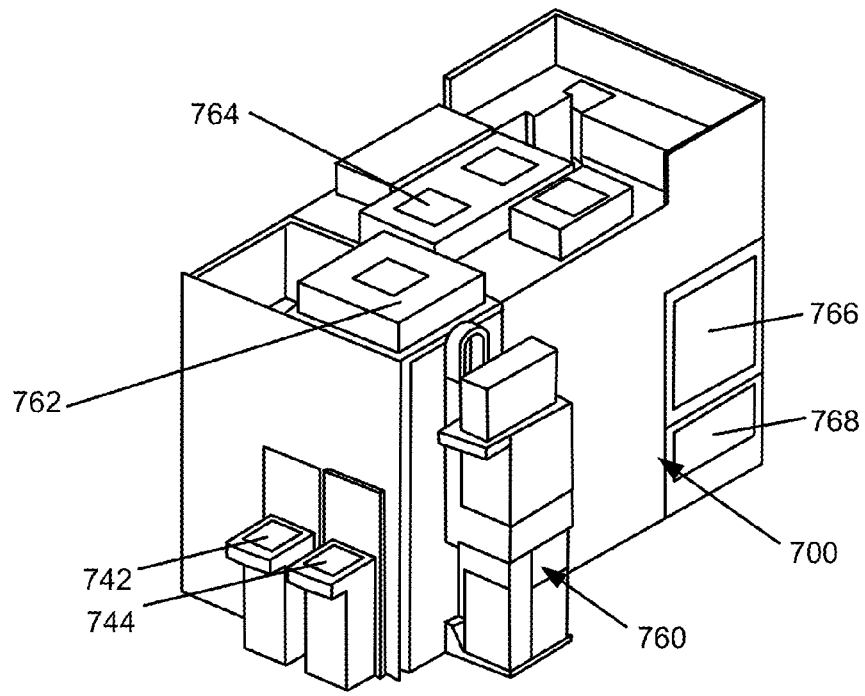
FIG. 7C shows an example of a three-dimensional perspective view of a remote plasma apparatus attached to an electroplating apparatus.

In some implementations, a remote plasma apparatus may be part of or integrated with the electroplating apparatus 700, and the annealing chamber 732 may be part of or integrated with the electroplating apparatus 700. FIG. 7B shows an example of a magnified top view schematic of a remote plasma apparatus 760 with an electroplating apparatus 700. However, it is understood by those of ordinary skill in the art that the remote plasma apparatus may alternatively be attached to any suitable metal deposition apparatus. FIG. 7C shows an example of a three-dimensional perspective view of a remote plasma apparatus 760 attached to an electroplating apparatus 700. The remote plasma apparatus 760 may be attached to the side of the electroplating apparatus 700. The remote plasma apparatus 760 may be connected to the electroplating apparatus 700 in such a way so as to facilitate efficient transfer of the substrate to and from the remote plasma apparatus 760 and the electroplating apparatus 700. The hand-off 740 may gain access to the substrate from cassette 742 or 744. The hand-off tool 740 may pass the substrate to the remote plasma apparatus 760 for exposing the substrate to a remote plasma treatment and a cooling operation. The hand-off tool 740 may pass the substrate from the remote plasma apparatus 760 to the transfer station 750. In some implementations, the aligner 748 may align the substrate prior to transfer to one of the electroplating modules 702, 704, and 706 or one of the three separate modules 712, 714, and 716.

Operations performed in the electroplating apparatus 700 may introduce exhaust that can flow through front-end exhaust 762 or a back-end exhaust 764. The electroplating apparatus 700 may also include a bath filter assembly 766 for the central electroplating station 724, and a bath and cell pumping unit 767 for the electroplating modules 702, 704, and 706.

In some implementations, the system controller 730 may control the parameters for the process conditions in the remote plasma apparatus 760. Non-limiting examples of such parameters include substrate support temperature, showerhead temperature, substrate support position, movable members position, cooling gas flow, cooling gas temperature, process gas flow, process gas pressure, venting gas flow, venting gas, reducing gas, plasma power, and exposure time, transfer time, etc. These parameters may be provided in the form of a recipe, which may be entered utilizing the user interface as described earlier herein.

Operations in the remote plasma apparatus 760 that is part of the electroplating apparatus 700 may be controlled by a computer system. In some implementations, the computer system is part of the system controller 730 as illustrated in FIG. 7A. In some implementations, the computer system may include a separate system controller (not shown) including program instructions. The program instructions may include instructions to perform all of the operations needed to reduce metal oxides to metal in a semi-noble metal layer or metal seed layer. The program instructions may also include instructions to perform all of the operations needed to cool the substrate, position the substrate, and load/unload the substrate.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

Examples and Data

Figure 8:
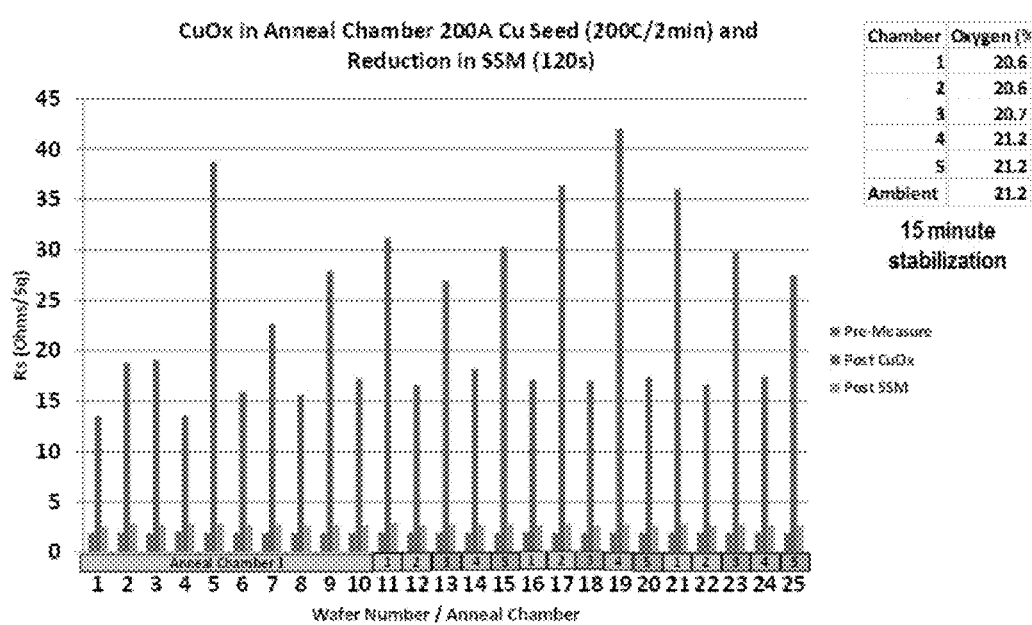
FIG. 8 shows measurements of sheet resistance pre-oxidation, post-oxidation, and post-reduction for 10 substrates oxidized through a single anneal chamber and for 15 substrates oxidized through different anneal chambers.

FIG. 8 shows measurements of sheet resistance pre-oxidation, post-oxidation, and post-reduction for 10 substrates oxidized through a single anneal chamber and for 15 substrates oxidized through different anneal chambers. Each of the substrates included a copper seed layer having a thickness of 200 Å. Each of the substrates were placed in one of five anneal chambers, where the first 10 substrates were placed in anneal chamber #1, and the remaining 15 substrates were divided evenly among anneal chambers #1-#5. The measured oxygen levels in each of the anneal chambers were reasonably consistent, with anneal chamber #1 having 20.6% oxygen, anneal chamber #2 having 20.6% oxygen, anneal chamber #3 having 20.7% oxygen, anneal chamber #4 having 21.2% oxygen, and anneal chamber #5 having 21.2% oxygen. The anneal chambers each underwent a 15 minute stabilization period. After the stabilization period, each of the substrates were exposed to oxygen in the anneal chamber for 120 seconds and exposed to a pedestal heated to 200° C. Copper oxide formed in the copper seed layers in the anneal chambers. Then the substrates were exposed to a reducing treatment in a remote plasma apparatus for 120 seconds. Sheet resistance values were measured for (1) pre-oxidation, (2) post-oxidation, and (3) post-reduction. Measurements were taken for 25 substrates and in different anneal chambers to demonstrate repeatability. The change in sheet resistance following reduction showed substantial drops from post-oxidation values to post-reduction values. Despite variations in the post-oxidation measurements, the post-reduction measurements showed very consistent sheet resistance values, where the post-reduction sheet resistance values were only slightly higher than the pre-oxidation sheet resistance values.

Figure 9:
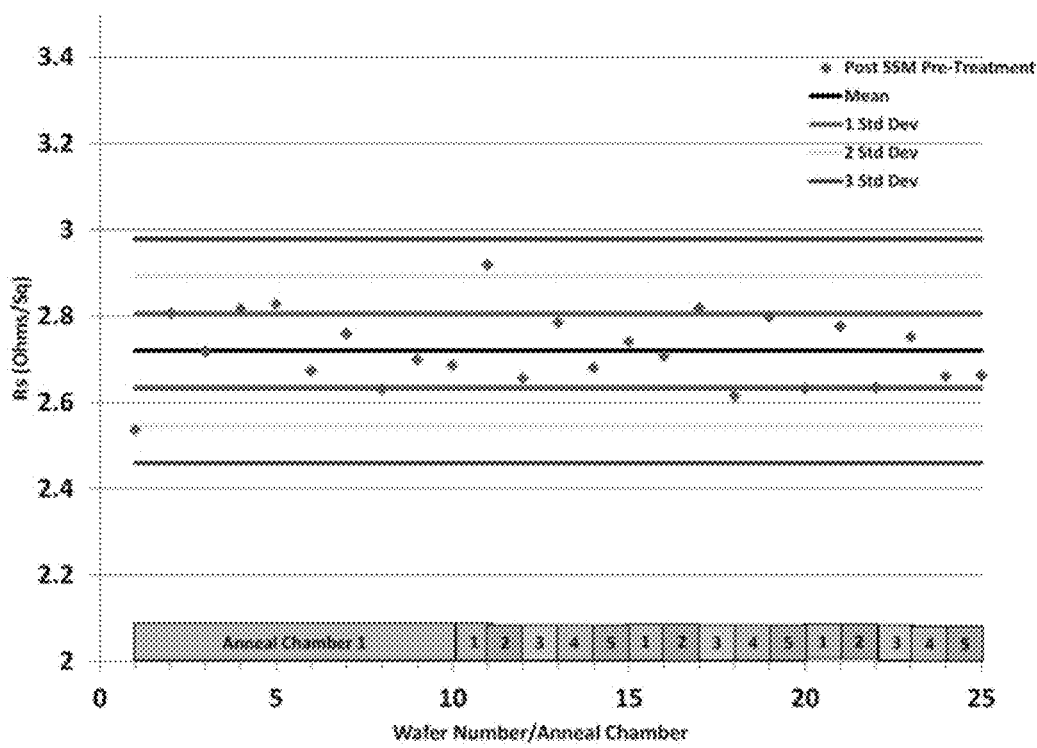
FIG. 9 shows post-reduction sheet resistance values for the 25 substrates with respect to the mean and with respect to the first, second, and third standard deviation values.

FIG. 9 shows post-reduction sheet resistance values for the 25 substrates with respect to the mean and with respect to the first, second, and third standard deviation values. The mean post-reduction sheet resistance value was between about 2.6 ohms/square and about 2.8 ohms/square. Regardless of the anneal chamber and regardless of the variation of sheet resistance values following oxidation, the 25 substrates were generally within two standard deviations of the mean post-reduction sheet resistance value. The data shows that the post-reduction sheet resistance values are consistent and that the reducing treatment of the copper oxide is effective.

Figure 10:
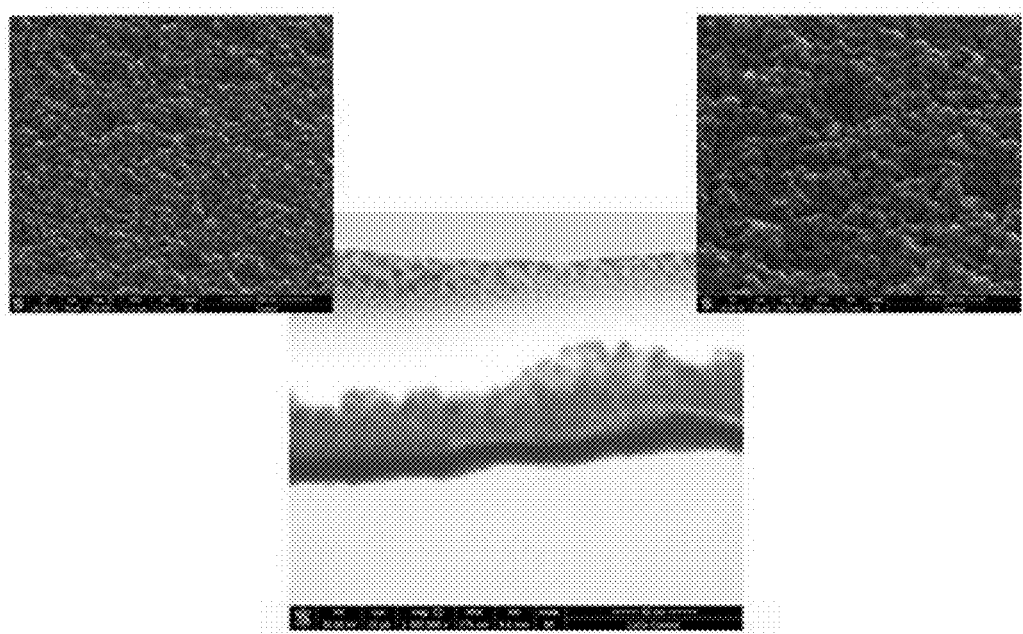
FIG. 10 shows scanning electron microscopy (SEM) and transmission electron microscopy (TEM) images of 200 Å of copper seed layer subjected to atmospheric annealing for 2 minutes at a temperature of 200° C.

FIG. 10 shows SEM and TEM images of 200 Å of copper seed layer subjected to atmospheric annealing for 2 minutes at a temperature of 200° C. The SEM images in FIG. 10 show the topography of the substrate having a metal oxide film, and the TEM image shows a thick layer of metal oxide in the substrate.

Figure 11:
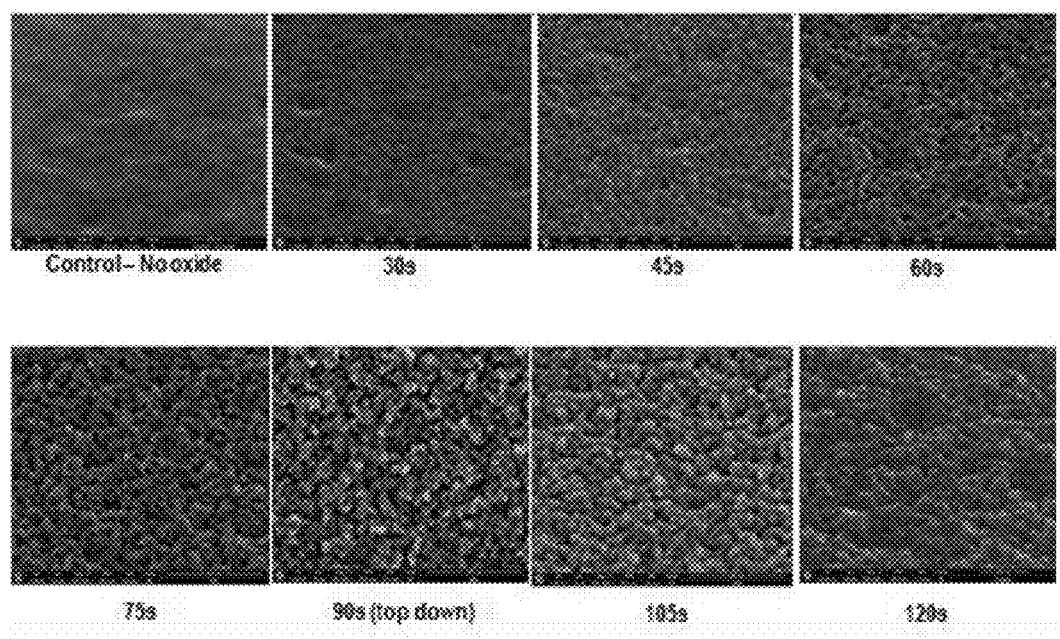
FIG. 11 shows SEM images of 200 Å copper seed layer subjected to atmospheric annealing for variable times at a temperature of 200° C.

FIG. 11 shows SEM images of 200 Å copper seed layer subjected to atmospheric annealing for variable times at a temperature of 200° C. Over time, the topography of the substrate shows copper oxide being formed.

Figure 12:
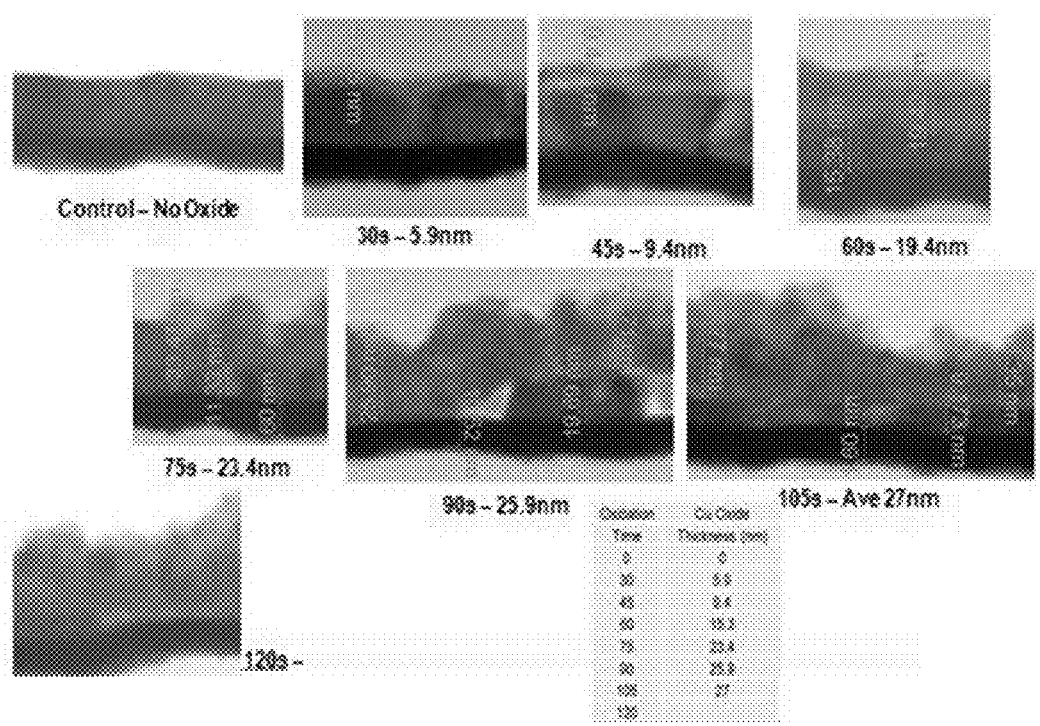
FIG. 12 shows TEM images of 200 Å copper seed layer subjected to atmospheric annealing for variable times at a temperature of 200° C.

FIG. 12 shows TEM images of 200 Å copper seed layer subjected to atmospheric annealing for variable times at a temperature of 200° C. The thicknesses of the copper oxide film increase with increasing oxidation time. After 120 seconds, substantially all of the copper seed layer is converted to copper oxide.

Figure 13:
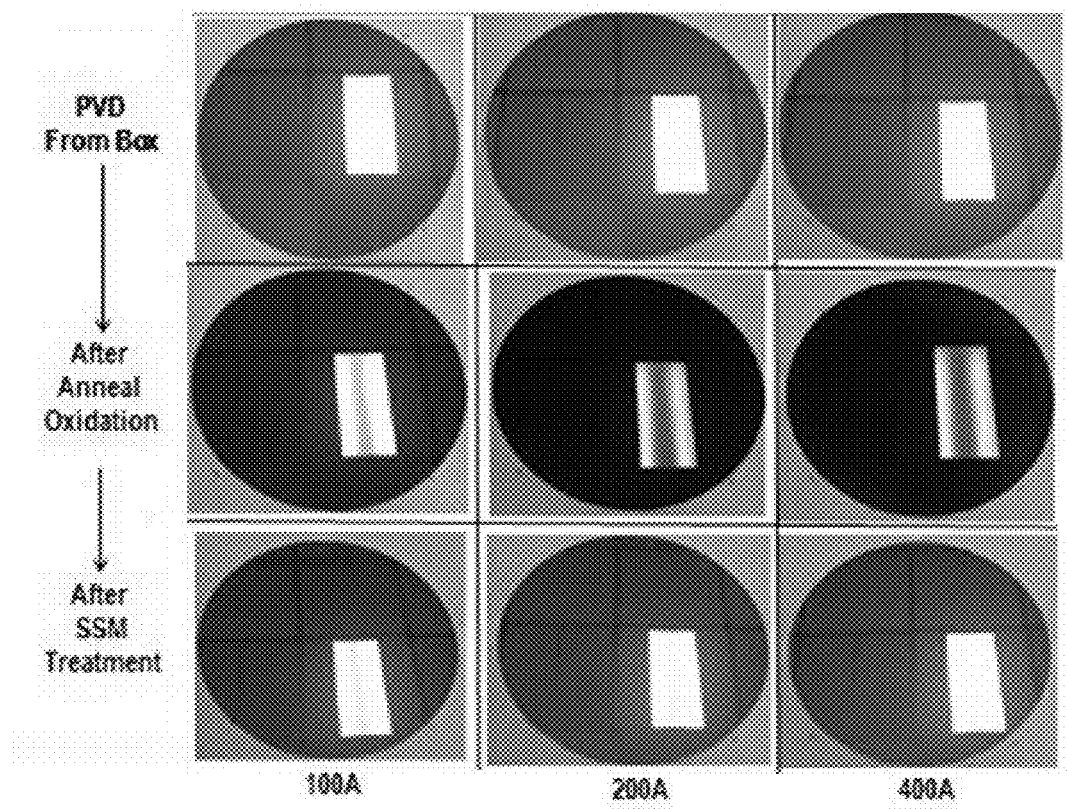
FIG. 13 shows images of wafers pre-oxidation, post-oxidation, and post-reduction for different thicknesses of copper seed.

FIG. 13 shows images of wafers pre-oxidation, post-oxidation, and post-reduction for different thicknesses of copper seed. Indications of the oxidation of the wafer and the reduction of the wafer can be shown demonstrated visually. Copper seed can be deposited via PVD onto a substrate in thicknesses of 100 Å, 200 Å, and 400 Å. The appearance of the substrates can be light-colored, shiny, and reflective. After oxidation through an anneal chamber, the appearance of the substrates can change to dark-colored, opaque, and non-reflective to show that metal oxides are formed. After exposing the substrates to a reducing treatment, such as a remote plasma reducing treatment, the appearance of the substrates can change back to light-colored, shiny, and reflective to show the removal of metal oxides.

Table 1 shows sheet resistance values for pre-oxidation, post-oxidation, and post-reduction wafers. The wafers varied in terms of seed layer thickness. The wafers varied in terms of annealing temperatures during oxidation. Percent change represents the change in sheet resistance value post-reduction and pre-oxidation divided by the pre-oxidation value. Thinner seed layer thicknesses demonstrated noticeably higher sheet resistance values after oxidation. Furthermore, the lower annealing temperature (e.g., 175° C.) demonstrated the smallest variation of sheet resistance value pre-oxidation and post-reduction. However, the post-oxidation sheet resistance values were not significantly high for the lower annealing temperatures. The signals for higher annealing temperatures were greater. Thus, a 200 Å copper seed layer annealed at 200° C. can provide an excellent reference point for metal oxide formation to characterize a metal oxide reduction process. The 200 Å copper seed layer annealed at 200° C. had a relatively high post-oxidation sheet resistance value (39.87 ohms/square) to give a strong indication of metal oxide formation, and had a reasonably small variation (31.2%) between pre-oxidation and post-reduction sheet resistance values to show the effectiveness of the reducing treatment in bringing the substrate back to its original state. In addition, the 200 Å copper seed layer annealed at 200° C. provides a strong visual indicator of oxidation and reduction as shown in FIG. 13.

TABLE I

| Temp (° C.) | Seed Thickness (Å) | Pre-Oxidation Sheet Resistance (ohms/sq) | Pre-Oxidation Std. Dev. (%) | Post-Oxidation Sheet Resistance (ohms/sq) | Post-Oxidation Std. Dev. (%) | Post-Reduction Sheet Resistance (ohms/sq) | Post-Reduction Std. Dev. (%) | Change (%) |
|---|---|---|---|---|---|---|---|---|
| 175 | 100 | 6.09 | 5.8% | 15.59 | 10.3% | 7.00 | 4.6% | 15.0% |
|  | 200 | 1.85 | 3.5% | 2.59 | 6.5% | 1.83 | 3.2% | −1.2% |
|  | 400 | 0.77 | 3.2% | 0.96 | 4.8% | 0.72 | 4.1% | −5.9% |
| 200 | 100 | 5.39 | 7.0% | 216.5 | 6.9% | 9.78 | 8.9% | 81.3% |
|  | 200 | 1.76 | 3.0% | 39.87 | 40.6% | 2.31 | 6.6% | 31.2% |
|  | 400 | 0.75 | 3.4% | 2.40 | 24.8% | 0.99 | 12.8% | 32.3% |
| 225 | 100 | 5.84 | 7.3% | 243.7 | 2.5% | 12.17 | 17.8% | 108.5% |
|  | 200 | 1.94 | 4.3% | 87.24 | 23.3% | 2.57 | 6.9% | 32.9% |
|  | 400 | 0.74 | 3.8% | 24.71 | 52.4% | 1.84 | 6.2% | 149.3% |

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of characterizing metal oxide reduction, the method comprising:
   (a) providing oxygen into an anneal chamber;
   (b) providing a substrate with a metal seed layer formed thereon in the anneal chamber;
   (c) exposing the substrate to conditions for forming a metal oxide of the metal seed layer in the anneal chamber, wherein the conditions include the substrate being heated to a temperature equal to or greater than about 50° C.;
   (d) providing the substrate in a processing chamber; and
   (e) exposing the substrate to a reducing treatment under conditions that reduce the metal oxide to metal in the form of a film integrated with the metal seed layer.

2. The method of claim 1, wherein providing oxygen into the anneal chamber comprises exposing the anneal chamber to atmospheric conditions.

3. The method of claim 1, wherein providing oxygen into the anneal chamber comprises:
   closing the anneal chamber from atmospheric conditions; and
   flowing oxygen into the anneal chamber.

4. The method of claim 1, wherein exposing the substrate to conditions for forming the metal oxide comprises converting greater than 90% of the metal of the metal seed layer to metal oxide.

5. The method of claim 1, further comprising:
heating a substrate support in the anneal chamber, wherein the substrate is provided on the heated substrate support.

6. The method of claim 5, wherein exposing the substrate to conditions for forming the metal oxide comprises exposing the substrate to the oxygen in the anneal chamber simultaneous with exposing the substrate to the heated substrate support.

7. The method of claim 5, wherein the temperature of the heated substrate support is between about 100° C. and about 400° C.

8. The method of claim 1, wherein the metal seed layer has a thickness between about 100 Å and about 400 Å.

9. The method of claim 1, further comprising:
measuring a first sheet resistance of the substrate prior to exposing the substrate to the reducing treatment; and
measuring a second sheet resistance of the substrate after exposing the substrate to the reducing treatment.

10. The method of claim 9, further comprising:
measuring a third sheet resistance of the substrate prior to exposing the substrate to conditions for forming the metal oxide.

11. The method of claim 1, further comprising:
repeating operations (a)-(c) for each of a plurality of additional substrates prior to providing the substrate in the processing chamber.

12. The method of claim 11, further comprising:
repeating operations (d)-(e) for each of the plurality of additional substrates after exposing the substrate to the reducing treatment.

13. The method of claim 1, wherein exposing the substrate to the reducing treatment comprises:
forming a remote plasma of a reducing gas species in a remote plasma source, wherein the remote plasma comprises one or more of: radicals, ions, and ultraviolet (UV) radiation from the reducing gas species; and
exposing the substrate to the remote plasma.

14. The method of claim 1, further comprising:
cooling the substrate prior to providing the substrate in the processing chamber but after exposing the substrate to conditions for forming the metal oxide.

* * * * *